US012155945B2

(12) United States Patent
Cho et al.

(10) Patent No.: US 12,155,945 B2
(45) Date of Patent: Nov. 26, 2024

(54) IMAGE SENSOR DEVICE AND OPERATION METHOD THEREOF

(71) Applicant: Samsung Electronics Co., Ltd., Suwon-si (KR)

(72) Inventors: Yongjun Cho, Hanam-si (KR); Sunyool Kang, Suwon-si (KR); Yunhong Kim, Seoul (KR); Heesung Chae, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 64 days.

(21) Appl. No.: 17/893,675

(22) Filed: Aug. 23, 2022

(65) Prior Publication Data

US 2023/0179884 A1    Jun. 8, 2023

(30) Foreign Application Priority Data

Dec. 6, 2021   (KR) .................. 10-2021-0173128

(51) Int. Cl.
*H04N 25/709* (2023.01)
*H01L 27/146* (2006.01)
*H04N 25/74* (2023.01)
*H04N 25/76* (2023.01)
*H04N 25/772* (2023.01)
*H04N 25/78* (2023.01)

(52) U.S. Cl.
CPC ..... *H04N 25/709* (2023.01); *H01L 27/14612* (2013.01); *H01L 27/14643* (2013.01); *H04N 25/772* (2023.01)

(58) Field of Classification Search
CPC .. H04N 25/709; H04N 25/772; H04N 25/745; H04N 25/766; H04N 25/78; H01L 27/146129; H01L 27/14643
See application file for complete search history.

(56) References Cited

U.S. PATENT DOCUMENTS

| 7,710,471 | B2 | 5/2010 | Takayanagi |
| 9,769,408 | B2 | 9/2017 | Kim et al. |
| 10,200,641 | B2 | 2/2019 | Sugawa et al. |
| 10,298,869 | B2 | 5/2019 | Aisu et al. |
| 10,356,350 | B2 | 7/2019 | Guidash et al. |
| 10,574,917 | B2 | 2/2020 | Kim et al. |
| 11,012,649 | B2 | 5/2021 | Guidash et al. |
| 12,022,001 | B1* | 6/2024 | Park ................ H04N 25/77 |
| 2006/0278809 | A1* | 12/2006 | Takayanagi ........ H04N 25/627 348/243 |
| 2008/0224191 | A1 | 9/2008 | Ahn et al. |
| 2011/0115958 | A1* | 5/2011 | Koseki ............... H04N 25/677 348/308 |
| 2014/0263966 | A1* | 9/2014 | Hikosaka ............. H04N 25/77 250/208.1 |

(Continued)

FOREIGN PATENT DOCUMENTS

KR    102178825 B1    11/2020

*Primary Examiner* — Marly S Camargo
(74) *Attorney, Agent, or Firm* — Harness, Dickey & Pierce, P.L.C.

(57) ABSTRACT

Disclosed is an image sensor device which includes an image pixel that outputs a reset voltage and a first data voltage through a data line, and a voltage hold circuit that is connected with the data line, stores a first voltage based on the reset voltage, and provides the data line with a second voltage based on the first voltage.

19 Claims, 17 Drawing Sheets

(56) References Cited

U.S. PATENT DOCUMENTS

2016/0366357 A1    12/2016  Shin
2019/0166321 A1*    5/2019  Ladd ...................... H03M 1/56
2024/0178242 A1*    5/2024  Kim .................. H01L 27/14612

* cited by examiner

IMAGE SENSOR DEVICE AND OPERATION METHOD THEREOF

CROSS-REFERENCE TO RELATED APPLICATIONS

This application claims priority under 35 U.S.C. § 119 to Korean Patent Application No. 10-2021-0173128 filed on Dec. 6, 2021, in the Korean Intellectual Property Office, the disclosures of which are incorporated by reference herein in their entireties.

BACKGROUND

Example embodiments of the present disclosure described herein relate to image sensors, and more particularly, relate to image sensor devices and operation methods thereof.

An image sensor converts a light received from the outside into an electrical signal. The image sensor is classified as a complementary metal-oxide-semiconductor (CMOS) image sensor or a charge coupled device (CCD) image sensor.

As the resolution of image data increases, nowadays, the number of pixels of the image sensor is increasing, and a time taken to read out data from the image sensor is decreasing. For example, a time period in which the image sensor reads out data to be output through data lines is decreasing. As such, there be developed various techniques for securing a settle time of a data line voltage.

SUMMARY

Example embodiments of the present disclosure provide image sensor devices with improved performance and operation methods thereof.

According to some example embodiments, an image sensor device may include an image pixel that outputs a reset voltage and a first data voltage through a data line, and a voltage hold circuit that is connected with the data line, stores a first voltage based on the reset voltage, and provides the data line with a second voltage based on the first voltage.

According to some example embodiments, an image sensor device may include a decoder that outputs a reset signal, a first transfer signal, and a selection signal, an image pixel that outputs a pixel output voltage through a data line in response to the reset signal, the first transfer signal, and the selection signal, a voltage hold circuit that is connected with the data line, and a sensor controller that controls the decoder and the voltage hold circuit. The voltage hold circuit may include a capacitor that is connected between a first node and a second node, a source follower that is connected between a first power supply voltage and a third node, and operates in response to a voltage of the first node, an enable switch that is connected between the third node and the data line, a store switch that is connected between the second node and the data line, and an initialize switch that is connected between an initialization voltage and the first node.

According to some example embodiments, an operation method of an image sensor device which includes a pixel configured to convert a light signal received from the output into an electrical signal and to output the electrical signal through a data line may include performing a reset operation on the pixel, storing a first voltage, based on a reset voltage, generated through the reset operation, in a voltage hold circuit while the reset voltage is output through the data line, providing a second voltage, generated based on the first voltage, from the voltage hold circuit to the data line while a first light integration operation is performed on the pixel, and outputting a first data voltage, generated through the first light integration operation, through the data line.

BRIEF DESCRIPTION OF THE FIGURES

The above and other objects and features of the present disclosure will become apparent by describing in detail embodiments thereof with reference to the accompanying drawings.

DETAILED DESCRIPTION

Below, example embodiments of the present disclosure will be described in detail and clearly to such an extent that one skilled in the art easily carries out the present disclosure. In the following description, specific details such as detailed components and structures are merely provided to assist the overall understanding of example embodiments of the present disclosure. Therefore, it should be apparent to those skilled in the art that various changes and modifications of the example embodiments described herein may be made without departing from the scope and spirit of the invention. In addition, the descriptions of well-known functions and structures are omitted for clarity and brevity. In the following drawings or in the detailed description, components may be connected with any other components except for components illustrated in a drawing or described in the detailed description. The terms described in the specification are terms defined in consideration of the functions in the present disclosure and are not limited to a specific function. The definitions of the terms should be determined based on the contents throughout the specification.

Components that are described in the detailed description with reference to the terms "driver", "block", etc. will be implemented with software, hardware, or a combination thereof. For example, the software may be a machine code, firmware, an embedded code, and application software stored on a non-transitory memory device as program instructions. For example, the hardware may include an electrical circuit, an electronic circuit, a processor, a computer, integrated circuit cores, a pressure sensor, inertial sensor, a micro electro mechanical system (MEMS), a passive element, or a combination thereof.

Figure 1:
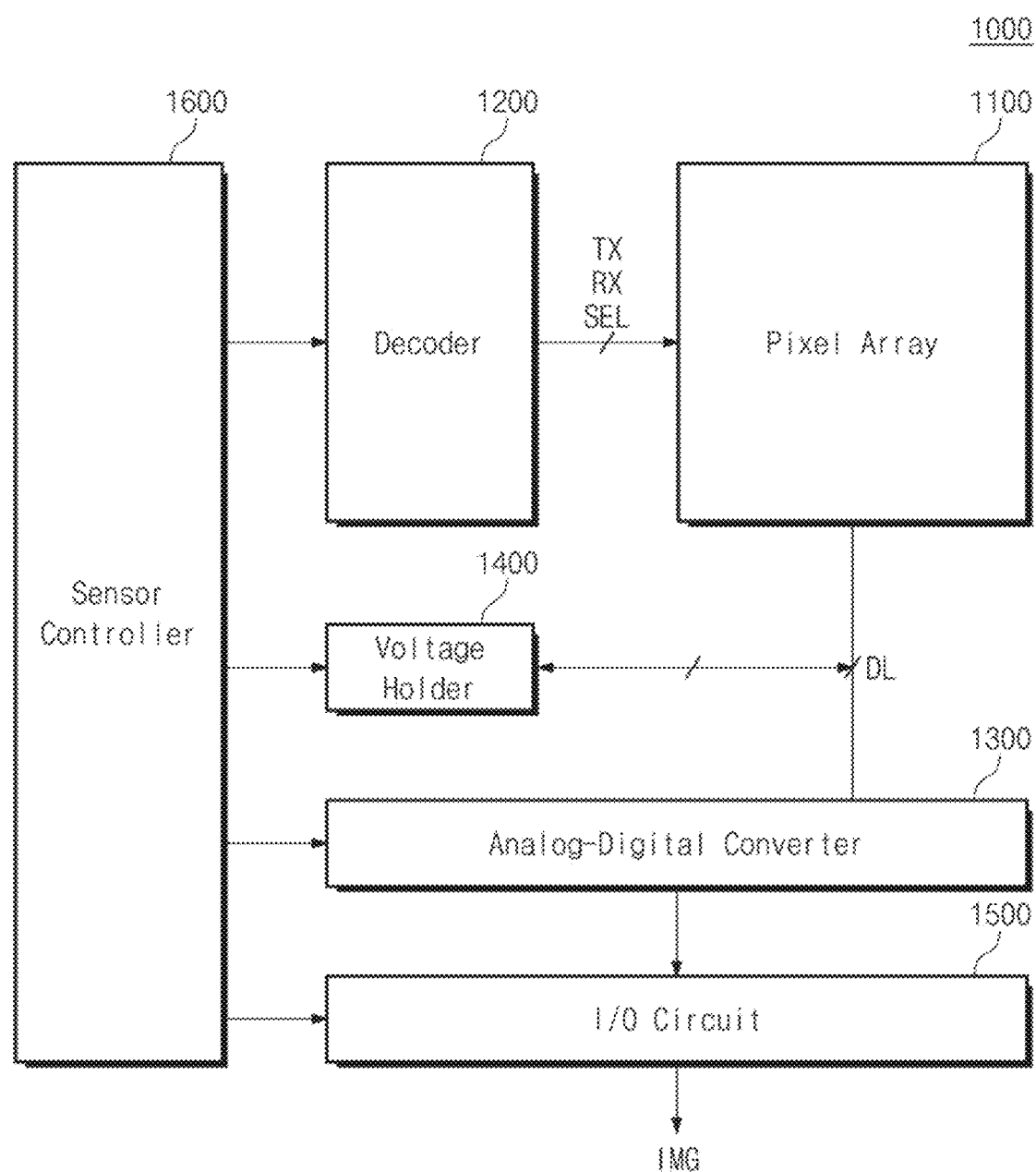
FIG. 1 is a block diagram illustrating an image sensor device according to some example embodiments of the present disclosure.

FIG. 1 is a block diagram illustrating an image sensor device according to some example embodiments of the present disclosure. Referring to FIG. 1, an image sensor device 1000 may include a pixel array 1100, a decoder 1200, an analog-to-digital converter 1300, a voltage holder 1400, an input/output circuit 1500, and a sensor controller 1600.

The pixel array 1100 may include a plurality of image pixels arranged in a row direction and a column direction. Each of the plurality of image pixels may generate a pixel output voltage under control of the decoder 1200. For example, each of the plurality of image pixels may generate a reset voltage or a data voltage. Pixel output voltages generated by the plurality of image pixels may be output through data lines DL.

The decoder 1200 may be connected with the pixel array 1100 through a plurality of signal lines. The decoder 1200 may provide a transfer signal TX, a reset signal RX, and a selection signal SEL to each of the plurality of image pixels through the plurality of signal lines.

The analog-to-digital converter 1300 may be connected with the pixel array 1100 through the data lines DL. The analog-to-digital converter 1300 may receive pixel output voltages (or analog voltages) from the data lines DL. The analog-to-digital converter 1300 may sample the received pixel output voltages so as to be converted into digital signals. For example, the analog-to-digital converter 1300 may perform sampling operations on the reset voltage and the data voltage, respectively, and may output a difference between result values of the sampling operations as a pixel value (e.g., a digital signal).

The voltage holder 1400 may include a plurality of voltage hold circuits. The voltage hold circuits may be respectively connected with the data lines DL. Under control of the sensor controller 1600, each of the plurality of voltage hold circuits may generate a hold voltage and may provide the hold voltage to the corresponding data line DL. In this case, the hold voltage may be used to hold (or maintain) a voltage level of the data line DL at a specific level. For example, a time period in which a voltage hold circuit outputs a hold voltage may be a time period in which a pixel output voltage is not transferred from an image pixel to the analog-to-digital converter 1300.

In some example embodiments, the hold voltage may be generated based on a pixel output voltage that is transferred from an image pixel to the analog-to-digital converter 1300. The voltage hold circuit and the hold voltage will be described in detail with reference to the following drawings.

The input/output circuit 1500 may receive digital signals from the analog-to-digital converter 1300. The input/output circuit 1500 may combine the received digital signals to output final image data IMG.

The sensor controller 1600 may control an overall operation of the image sensor device 1000. For example, the sensor controller 1600 may control the pixel array 1100, the decoder 1200, the analog-to-digital converter 1300, the voltage holder 1400, and the input/output circuit 1500 to generate the image data IMG.

In some example embodiments, the image sensor device 1000 may be implemented by bonding a first semiconductor circuit substrate and a second semiconductor circuit substrate. For example, the second semiconductor circuit substrate may be bonded on a lower or rear surface of the first semiconductor circuit substrate. The first semiconductor circuit substrate may include the pixel array 1100. The second semiconductor circuit substrate may include the decoder 1200, the analog-to-digital converter 1300, the voltage holder 1400, the input/output circuit 1500, and the sensor controller 1600.

In some example embodiments, the first semiconductor circuit substrate and the second semiconductor circuit substrate may be manufactured through different processes.

Figure 2:
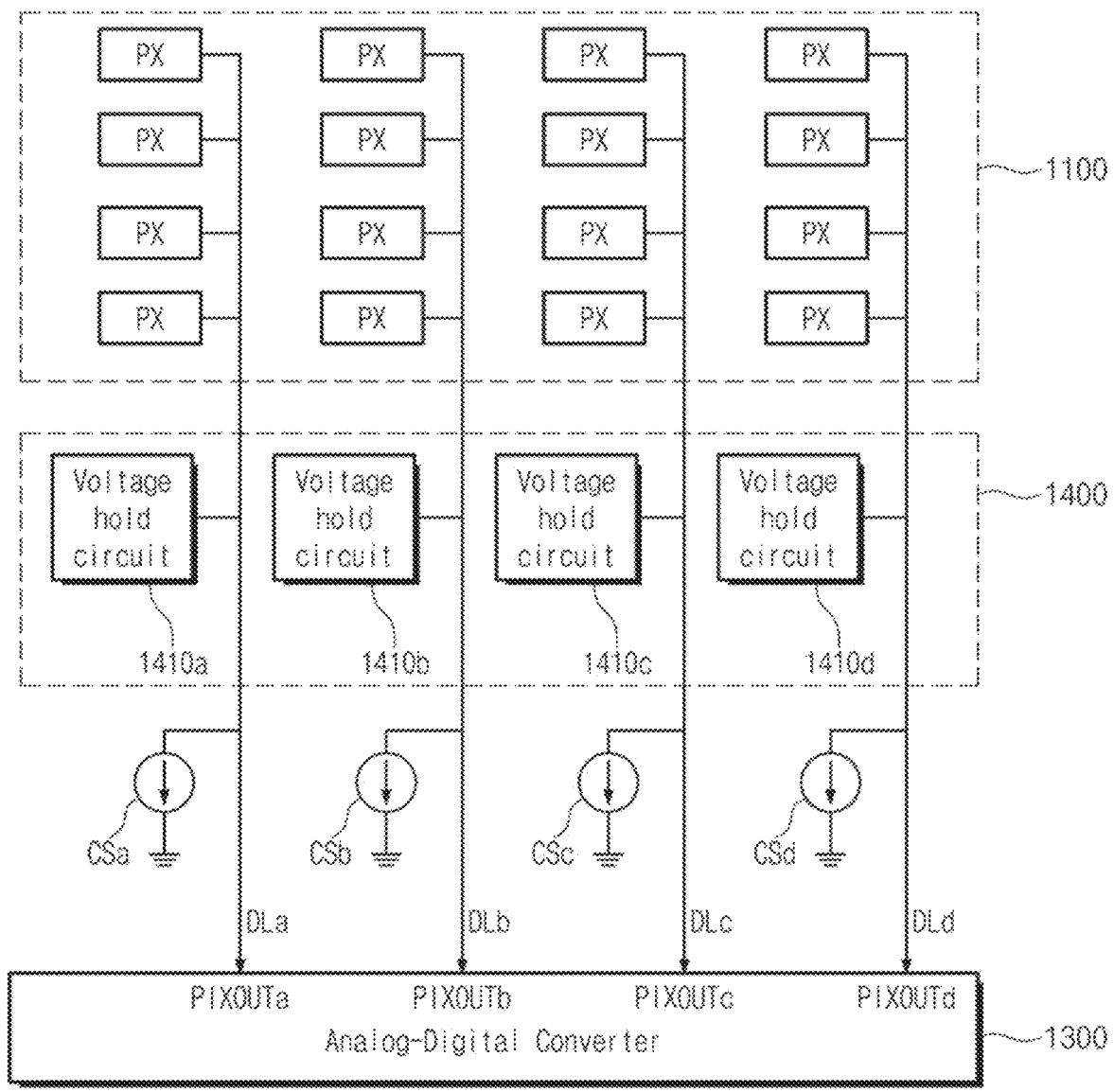
FIG. 2 is a block diagram illustrating a partial configuration of an image sensor device of FIG. 1 in detail.

FIG. 2 is a block diagram illustrating a partial configuration of an image sensor device of FIG. 1 in detail. For brevity of illustration and for convenience of description, a partial configuration of the image sensor device 1000 is illustrated, but the present disclosure is not limited thereto. Also, an example in which a plurality of image pixels PX of the pixel array 1100 are arranged along first to fourth rows and first to fourth columns (e.g., to form a 4×4 matrix), but the present disclosure is not limited thereto. For example, the pixel array 1100 may include additional pixels that are further arranged in the row direction or the column direction.

In some example embodiments, the pixel array 1100 may include various types of color filter arrays. For example, the pixel array 1100 may include a color filter array configured to allow each image pixel to receive a light signal corresponding to a given color.

In some example embodiments, the color filter array may include at least one of various color filter array patterns such as a Bayer pattern, an RGBE pattern, a CYYM pattern, a CYGM pattern, a BGBW Bayer pattern, a BGBW pattern, and a tetra pattern.

Continuing to refer to FIGS. 1 and 2, the image sensor device 1000 may include the pixel array 1100, the voltage holder 1400, and the analog-to-digital converter 1300. The pixel array 1100 may include the plurality of image pixels PX. Among the plurality of image pixels PX, image pixels placed at the first column may be connected with a first data line DLa, image pixels placed at the second column may be connected with a second data line DLb, image pixels at the third column may be connected with a third data line DLc, and image pixels placed at the fourth column may be connected with a fourth data line DLd.

The plurality of image pixels PX may generate first to fourth pixel output voltages PIXOUTa to PIXOUTd. For example, among the plurality of image pixels PX, image pixels connected with the first data line DLa may generate the first pixel output voltages PIXOUTa, image pixels connected with the second data line DLb may generate the second pixel output voltages PIXOUTb, image pixels connected with the third data line DLc may generate the third pixel output voltages PIXOUTc, and image pixels connected with the fourth data line DLd may generate the fourth pixel output voltages PIXOUTd.

The plurality of image pixels PX may output the first to fourth pixel output voltages PIXOUTa to PIXOUTd through the first to fourth data lines DLa to DLd in response to the selection signal SEL.

In some example embodiments, each of the first to fourth pixel output voltages PIXOUTa to PIXOUTd may be a reset voltage generated through a reset operation of a corresponding image pixel or a data voltage generated through a light integration operation.

First to fourth current sources CSa to CSd may be respectively connected with the first to fourth data lines DLa to DLd. The first to fourth current sources CSa to CSd may be used to hold voltages of the first to fourth data lines DLa to DLd at a specific level.

In some example embodiments, there may be a time period in which the first to fourth pixel output voltages PIXOUTa to PIXOUTd are not transferred through the first to fourth data lines DLa to DLd. For example, the first data line DLa may transfer the first pixel output voltages PIXOUTa during a first time period and may not transfer the first pixel output voltages PIXOUTa during a second time period. In this case, the first data line DLa may be floated during the second time period. As in the above description, a time period in which each of the first to fourth data lines DLa to DLd is floated may exist. Also, charges present on the first to fourth data lines DLa to DLd may be quickly discharged by the first to fourth current sources CSa to CSd. According to the above description, as the first to fourth data lines DLa to DLd are floated, the probability that the unintended mutual interaction (e.g., the coupling) with any other circuits adjacent thereto occurs may increase.

The voltage holder 1400 may include first to fourth voltage hold circuits 1410*a* to 1410*d*. The first to fourth data lines DLa to DLd may be respectively connected with the first to fourth data lines DLa to DLd. Each of the first to fourth voltage hold circuits 1410*a* to 1410*d* may be used to prevent a data line connected therewith from being floated. For example, each of the first to fourth voltage hold circuits 1410*a* to 1410*d* may be configured in such a way that the data line connected therewith outputs a hold voltage during a time period in which a pixel output voltage is not transferred. How a voltage hold circuit 1410 generates the hold voltage will be described in detail with reference to the following drawings.

The analog-to-digital converter 1300 may be connected with the first to fourth data lines DLa to DLd. The analog-to-digital converter 1300 may receive the first to fourth pixel output voltages PIXOUTa to PIXOUTd from the first to fourth data lines DLa to DLd. The analog-to-digital converter 1300 may sample the first to fourth pixel output voltages PIXOUTa to PIXOUTd thus received, so as to be converted into digital signals.

Figure 3A:
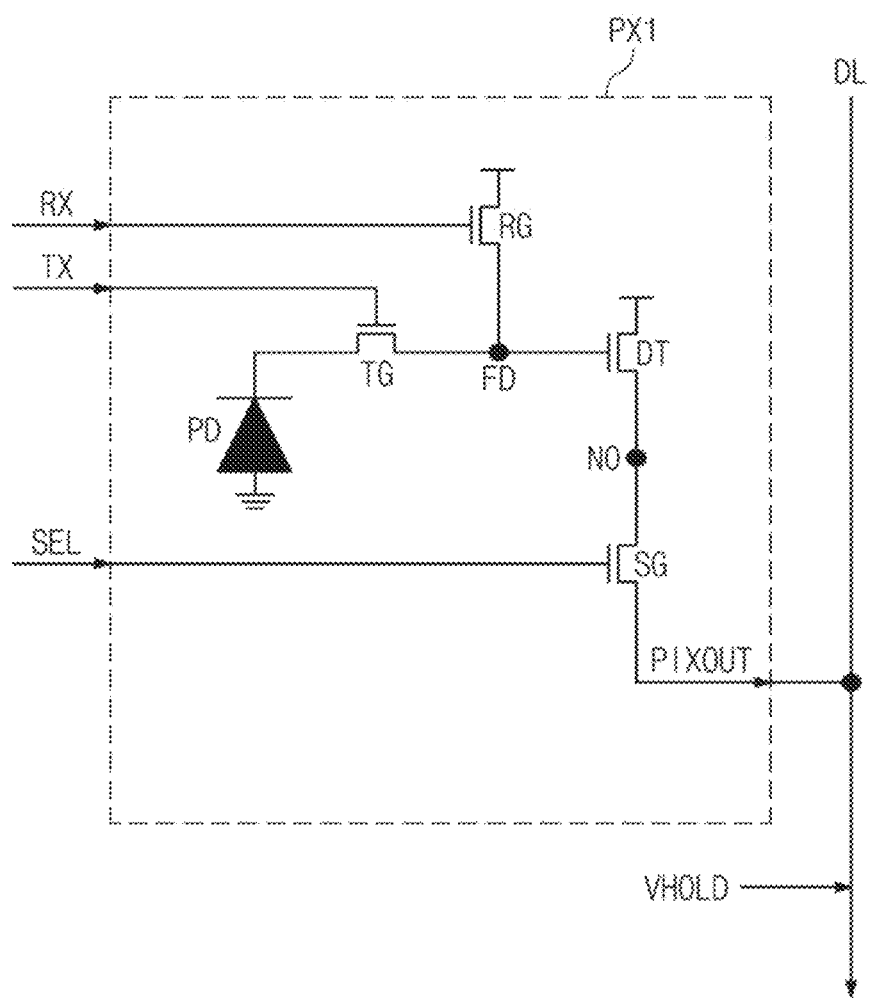
FIGS. 3A and 3B are circuit diagrams illustrating a configuration of an image pixel of FIG. 2.
Figure 3B:
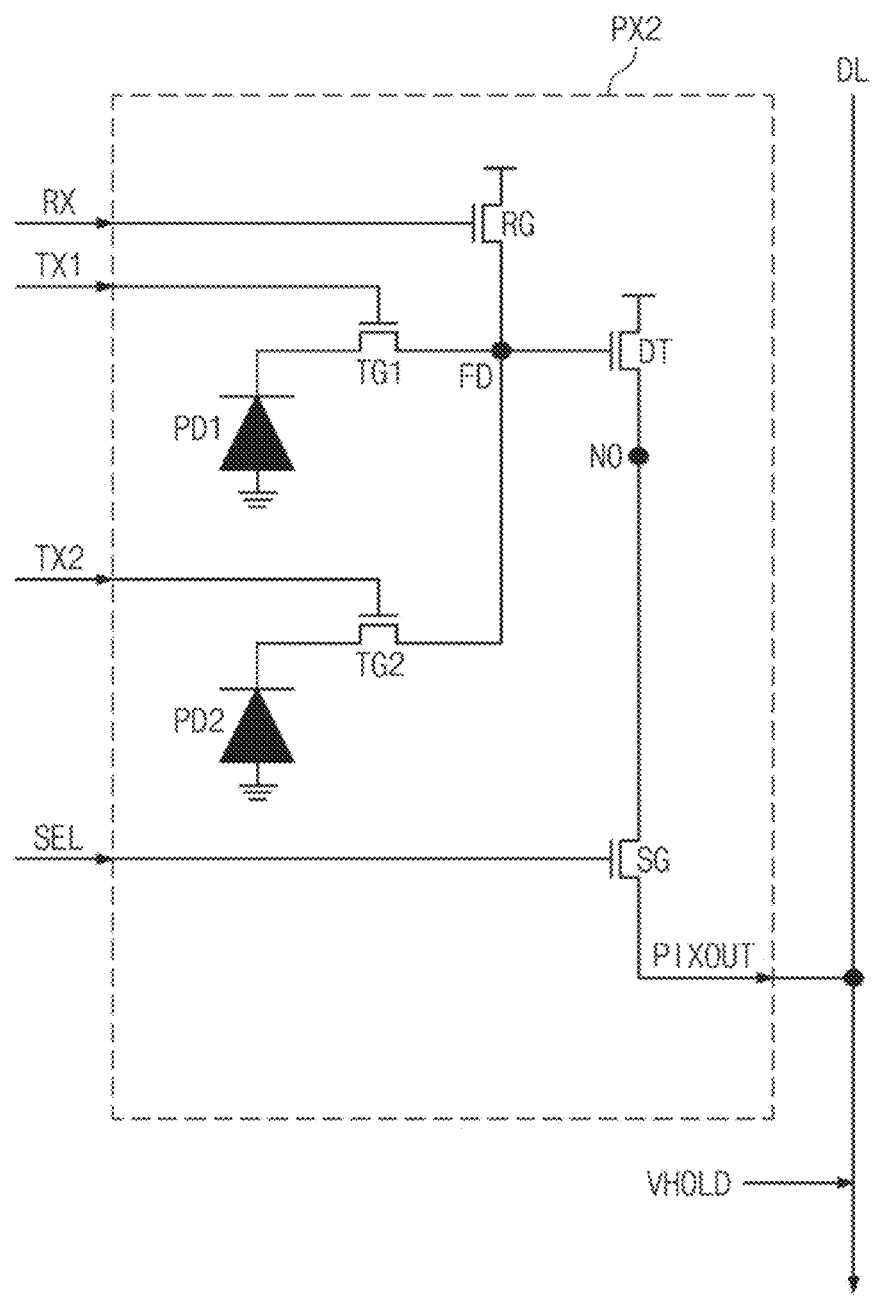

FIGS. 3A and 3B are circuit diagrams illustrating a configuration of an image pixel of FIG. 2. Below, an image pixel of a 4-transistor, 1-photodiode (4TR-1PD) structure will be described with reference to FIG. 3A, and an image pixel of a 5-transistor, 2-photodiode (5TR-2PD) structure will be described with reference to FIG. 3B. However, the present disclosure is not limited thereto. Image pixels included in the pixel array 1100 may be implemented in various other structures.

Referring to FIGS. 1 and 3A, an image pixel PX1 may output a pixel output voltage PIXOUT through the data line DL in response to the reset signal RX, the transfer signal TX, and the selection signal SEL from the decoder 1200.

For example, the image pixel PX1 may include a photodiode PD, a transfer gate TG, a reset gate RG, a drive transistor DT, and a select gate SG.

The photodiode PD may be configured to integrate (or accumulate) charges in response to a light signal received from the outside.

The transfer gate TG may be connected between the photodiode PD and a floating diffusion node PD. The transfer gate TG may operate in response to the transfer signal TX from the decoder 1200. For example, the transfer gate TG may be turned on in response to the transfer signal TX of logic high. In this case, charges may move from the photodiode PD to the floating diffusion node FD. In this case, a voltage of the floating diffusion node FD may decrease.

The reset gate RG may be connected between a power supply voltage and the floating diffusion node FD. The reset gate RG may operate in response to the reset signal RX from the decoder 1200. For example, the reset gate RG may be turned on in response to the reset signal RX of logic high. In this case, the floating diffusion node PD may be charged with the power supply voltage.

The drive transistor DT may be connected between the power supply voltage and a 0-th node NO. The drive transistor DT may operate in response to a voltage of the floating diffusion node FD. For example, a gate terminal of the drive transistor DT may be connected with the floating diffusion node FD. In this case, the drive transistor DT may be configured to transfer a voltage corresponding to the variations in the voltage of the floating diffusion node FD to the select gate SG. That is, the drive transistor DT may operate as a source follower whose input terminal is connected with the floating diffusion node FD.

In some example embodiments, the power supply voltage connected with the drive transistor DT may be identical to the power supply voltage connected with the reset gate RG. For example, the power supply voltage connected with the drive transistor DT and the reset gate RG may be referred to as a "pixel array power supply voltage". However, the present disclosure is not limited thereto. For example, power supply voltages whose magnitudes are equal to or different from each other may be connected with the drive transistor DT and the reset gate RG.

In some example embodiments, an operation of charging the floating diffusion node FD with the power supply voltage may be referred to as a "reset operation". An operation in which a voltage of the floating diffusion node FD is decreased by charges transferred from the photodiode PD may be referred to as a "light integration operation".

In some example embodiments, a voltage that the drive transistor DT outputs based on a voltage of the floating diffusion node FD charged with the power supply voltage through the reset operation may be referred to as a "reset voltage". A voltage that the drive transistor DT outputs based on a voltage of the floating diffusion node FD decreased through the light integration operation may be referred to as a "data voltage".

The select gate SG may be connected between the 0-th node NO and the data line DL. The select gate SG may operate in response to the selection signal SEL from the decoder 1200. For example, the select gate SG may transfer a signal (e.g., a voltage corresponding to the variations in the voltage of the floating diffusion node FD) from the drive transistor DT to the data line DL in response to the selection signal SEL of logic high.

In some example embodiments, the data line DL may be provided with a hold voltage VHOLD. For example, the data line DL may be provided with the hold voltage VHOLD from the voltage hold circuit 1410 in a time period in which the selection signal SEL is at logic low.

Referring to FIGS. 1 and 3B, an image pixel PX2 may output the pixel output voltage PIXOUT through the data line DL in response to the reset signal RX, first and second transfer signals TX1 and TX2, and the selection signal SEL from the decoder 1200.

The image pixel PX2 may include first and second photodiodes PD1 and PD2, first and second transfer gates TG1 and TG2, the reset gate RG, the drive transistor DT, and the select gate SG.

Operations of the reset gate RG, the drive transistor DT, and the select gate SG of the image pixel PX2 are similar to those of the image pixel PX1 described with reference to FIG. 3A, and thus, additional description will be omitted to avoid redundancy. Below, a difference between the image pixel PX1 and the image pixel PX2 will be mainly described.

The first transfer gate TG1 may be connected between the first photodiode PD1 and the floating diffusion node FD, and the second transfer gate TG2 may be connected between the second photodiode PD2 and the floating diffusion node FD. The first transfer gate TG1 may operate in response to the first transfer signal TX1, and the second transfer gate TG2 may operate in response to the second transfer signal TX2. For example, the first transfer gate TG1 may be turned on in response to the first transfer signal TX1 of logic high, and the second transfer gate TG2 may be turned on in response to the second transfer signal TX2 of logic high. In this case, charges may move from the first photodiode PD1 to the floating diffusion node FD in response to the first transfer signal TX1, and charges may move from the second photodiode PD2 to the floating diffusion node FD in response to the second transfer signal TX2.

In some example embodiments, the first transfer signal TX1, the second transfer signal TX2, and/or a combination thereof may be sequentially set to logic high. For example, the second transfer signal TX2 may be set to logic high after the first transfer signal TX1 is set to logic high. Alternatively, both the first transfer signal TX1 and the second transfer signal TX2 may be set to logic high after the first transfer signal TX1 is set to logic high. Below, for brevity of description, some example embodiments in which the second transfer signal TX2 is set to logic high after the first transfer signal TX1 is set to logic high will be described. However, the present disclosure is not limited thereto. For example, the present disclosure may include some example embodiments in which the first transfer signal TX1, the second transfer signal TX2, and/or a combination thereof is sequentially set to logic high.

In some example embodiments, the data line DL may be provided with the hold voltage VHOLD. For example, the data line DL may be provided with the hold voltage VHOLD from the voltage hold circuit 1410 in a time period in which the selection signal SEL is at logic low.

Figure 4:
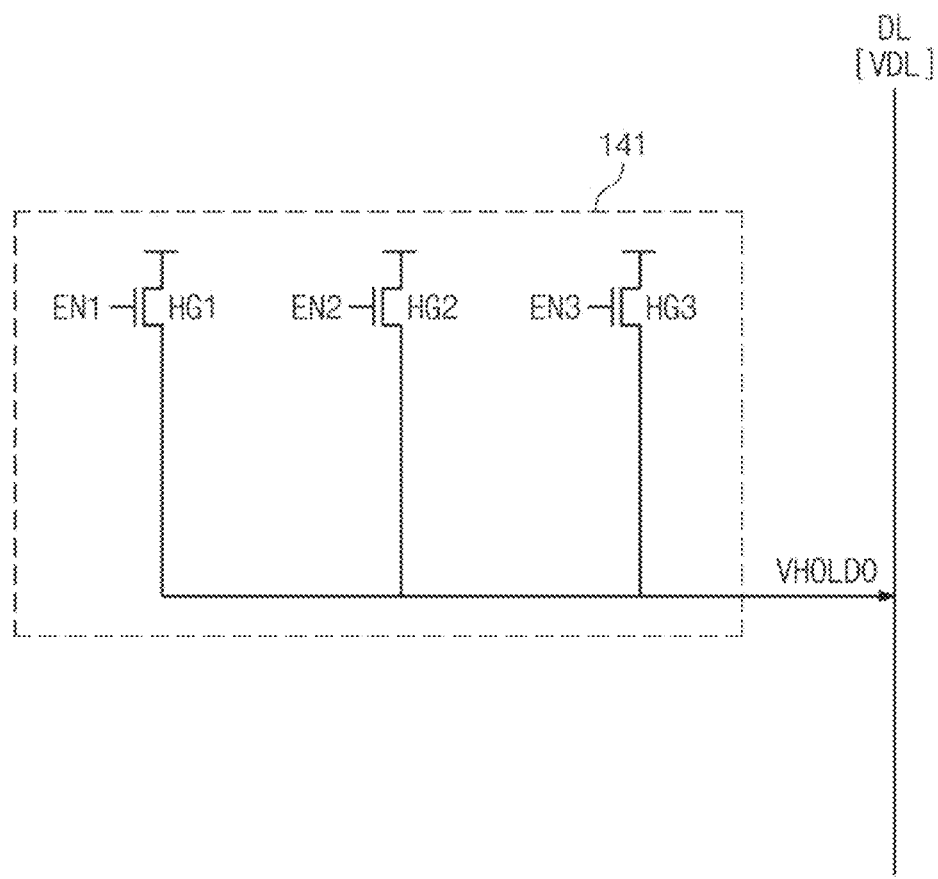
FIG. 4 is a circuit diagram illustrating a voltage hold circuit of FIG. 2.

FIG. 4 is a circuit diagram illustrating a voltage hold circuit of FIG. 2. Referring to FIGS. 1 to 4, a voltage hold circuit 141 may include first to third hold gates HG1, HG2, and HG3. Each of the first to third hold gates HG1, HG2, and HG3 may be connected between the power supply voltage and the data line DL. The first to third hold gates HG1, HG2, and HG3 may respectively receive first to third enable signals EN1, EN2, and EN3. The first to third hold gates HG1, HG2, and HG3 may provide a hold voltage VHOLD0 to the data line DL in response to the first to third enable signals EN1, EN2, and EN3.

In some example embodiments, the first to third enable signals EN1, EN2, and EN3 may be provided from the sensor controller 1600.

In some example embodiments, a magnitude of the hold voltage VHOLD0 may be implemented to be equal to a magnitude of the reset voltage. Below, a data line voltage VDL corresponding to the case where the voltage hold circuit 141 provides the hold voltage VHOLD0 (e.g., the case where a magnitude of the hold voltage VHOLD0 is equal to a magnitude of the reset voltage) will be described in detail. For brevity of description, it is assumed that the magnitude of the hold voltage VHOLD0 is determined only by the magnitude of the reset voltage or logic low.

Figure 5A:
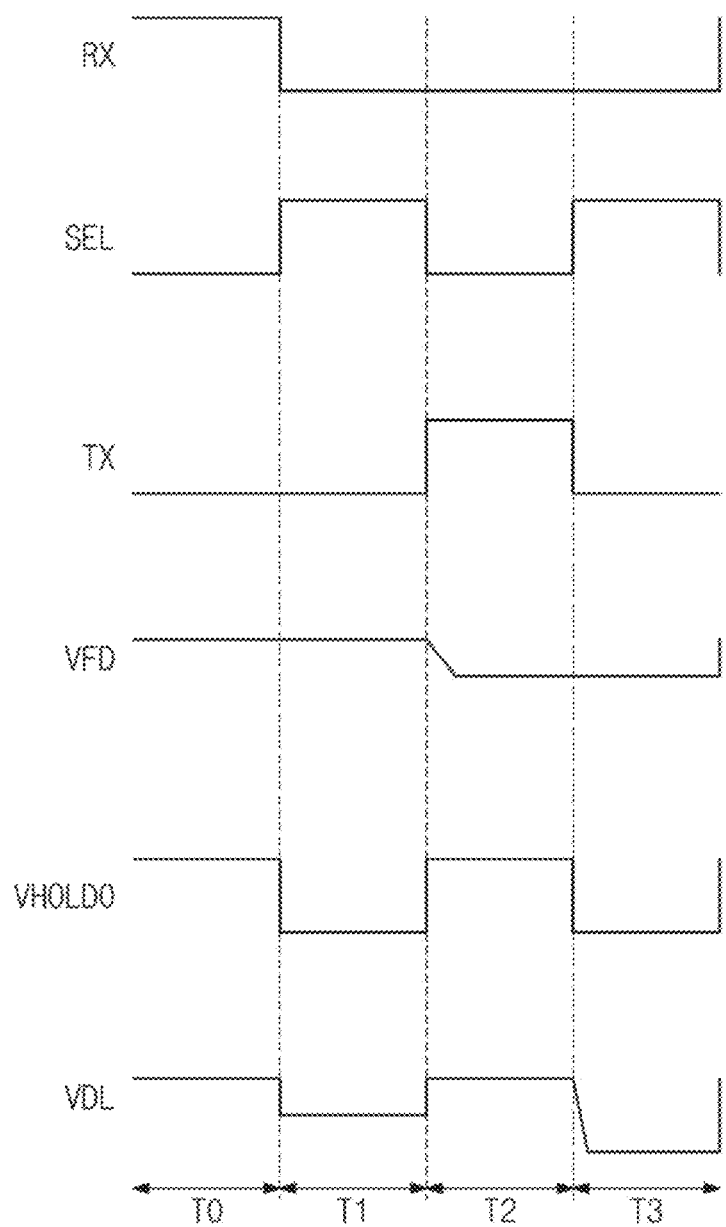
FIGS. 5A and 5B are timing diagrams for describing an operation of a voltage hold circuit of FIG. 4.
Figure 5B:
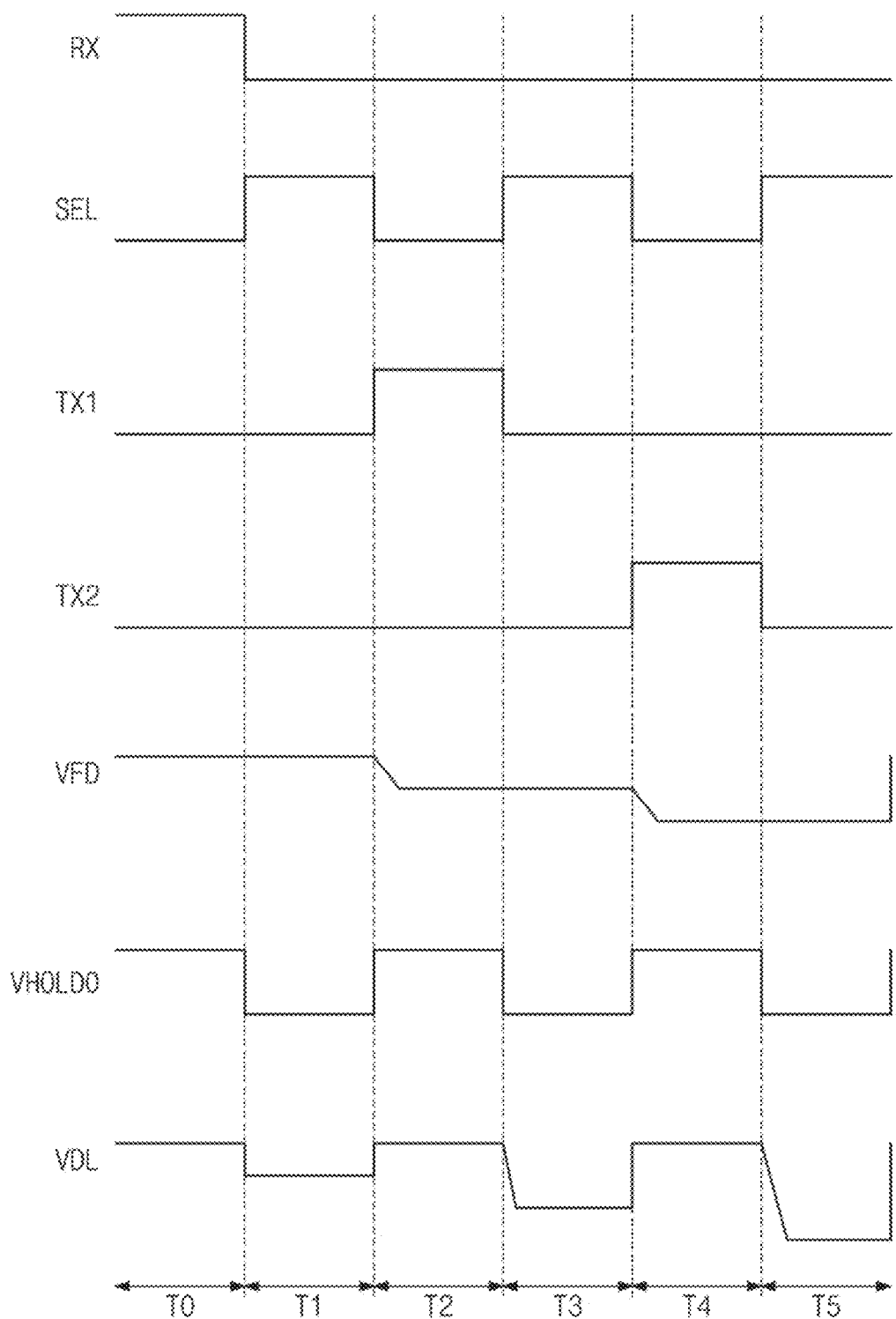

FIGS. 5A and 5B are timing diagrams for describing an operation of a voltage hold circuit of FIG. 4. Below, operations of the image pixel PX1 and the voltage hold circuit 141 and the data line voltage VDL will be described with reference to FIGS. 2, 3A, 4, and 5A, and operations of the image pixel PX2 and the voltage hold circuit 141 and the data line voltage VDL will be described with reference to FIGS. 2, 3B, 4, and 5B.

First, referring to FIGS. 2, 3A, 4, and 5A, the reset operation may be performed on the image pixel PX1 in a 0-th time period T0. For example, in the 0-th time period T0, the reset signal RX may be set to logic high, and the selection signal SEL may be set to logic low. In this case, the reset gate RG may be turned on in response to the reset signal RX, and thus, a voltage VFD (hereinafter referred to as a "floating diffusion node voltage VFD") of the floating diffusion node FD may be charged to the power supply voltage. In contrast, the select gate SG that operates in response to the selection signal SEL may be turned off. Accordingly, in the 0-th time period T0, the voltage hold circuit 141 may provide the hold voltage VHOLD0 to the data line DL.

In some example embodiments, a magnitude of the data line voltage VDL in the 0-th time period T0 may be equal to a magnitude of the hold voltage VHOLD0. In this case, the magnitude of the data line voltage VDL in the 0-th time period T0 may correspond to the magnitude of the reset voltage.

In a first time period T1, the analog-to-digital converter 1300 may perform the reset sampling operation on the reset voltage. For example, in the first time period T1, the reset signal RX may be set to logic low, and the selection signal SEL may be set to logic high. The image pixel PX1 may output the reset voltage through the data line DL in response to the selection signal SEL of logic high. In this case, the voltage hold circuit 141 may not provide the hold voltage VHOLD0 to the data line DL. According to the above description, the magnitude of the data line voltage VDL in the first time period T1 may be equal to the magnitude of the reset voltage.

In a second time period T2, the light integration operation may be performed on the image pixel PX1. For example, in the second time period T2, the transfer signal TX may be set to logic high, and the selection signal SEL may be set to logic low. As the transfer gate TG is turned on in response to the transfer signal TX of logic high, the floating diffusion node voltage VFD may decrease. The select gate SG may be turned off in response to the selection signal SEL of logic low. In this case, the voltage hold circuit 141 may provide the hold voltage VHOLD0 to the data line DL.

In some example embodiments, the voltage hold circuit 141 may provide the hold voltage VHOLD0 of the same magnitude to the data line DL in the 0-th time period T0 and the second time period T2.

In a third time period T3, the analog-to-digital converter 1300 may perform the data sampling operation on the data voltage. For example, in the third time period T3, the transfer signal TX may be set to logic low, and the selection signal SEL may be set to logic high. As such, the image pixel PX1 may output the data voltage through the data line DL in response to the selection signal SEL of logic high. In this case, the voltage hold circuit 141 may not provide the hold voltage VHOLD0 to the data line DL. According to the above description, the magnitude of the data line voltage VDL in the third time period T3 may be equal to the magnitude of the data voltage.

In some example embodiments, when a transition from the second time period T2 to the third time period T3 is made, a settle time for a change of the data line voltage VDL may be required. For example, the settle time may refer to a time necessary until the data line voltage VDL transitions from the hold voltage VHOLD0 to the data voltage and is settled. The settle time may be determined by a difference between the data line voltage VDL before the transition is made and the data line voltage VDL after the transition is made. In the case where the settle time increases, an operating speed of the analog-to-digital converter 1300 of FIG. 1 may decrease, thereby causing the reduction of performance of an image sensor device.

Referring to FIGS. 2, 3B, 4, and 5B, the reset operation may be performed on the image pixel PX2 in a 0-th time period T0. In a first time period T1, the analog-to-digital converter 1300 may perform the reset sampling operation on the reset voltage. Operations of the image pixel PX2 and the voltage hold circuit 141 and the data line voltage VDL in the 0-th and first time periods T0 and T1 are similar to those in the 0-th and first time periods T0 and T1 described with reference to FIG. 5A, and thus, additional description will be omitted to avoid redundancy.

In a second time period T2, a first light integration operation may be performed on the image pixel PX2. For example, in the second time period T2, the first transfer signal TX1 may be set to logic high, and the selection signal SEL may be set to logic low. In this case, the floating diffusion node voltage VFD may decrease. In the second time period T2, the select gate SG may be turned off. Accordingly, in the second time period T2, the voltage hold circuit 141 may provide the hold voltage VHOLD0 to the data line DL.

In a third time period T3, the analog-to-digital converter 1300 may perform a first data sampling operation on a first data voltage. For example, the first data voltage may refer to a voltage that is generated by the drive transistor DT based on a voltage of the floating diffusion node FD decreased through the first light integration operation.

In the third time period T3, the first transfer signal TX1 may be set to logic low, and the selection signal SEL may be set to logic high. The image pixel PX2 may output the first data voltage through the data line DL in response to the selection signal SEL of logic high. In this case, the voltage hold circuit 141 may not provide the hold voltage VHOLD0 to the data line DL. According to the above description, the magnitude of the data line voltage VDL in the third time period T3 may be equal to the magnitude of the first data voltage.

In a fourth time period T4, a second light integration operation may be performed on the image pixel PX2. For example, in the fourth time period T4, the second transfer signal TX2 may be set to logic high, and the selection signal SEL may be set to logic low. As the second transfer gate TG2 is turned on in response to the second transfer signal TX2 of logic high, the floating diffusion node voltage VFD may further decrease. The select gate SG may be turned off in response to the selection signal SEL of logic low. In this case, the voltage hold circuit 141 may provide the hold voltage VHOLD0 to the data line DL.

In some example embodiments, the voltage hold circuit 141 may provide the hold voltage VHOLD0 of the same magnitude to the data line DL in the 0-th time period T0, the second time period T2, and the fourth time period T4.

In a fifth time period T5, the analog-to-digital converter 1300 may perform a second data sampling operation on a second data voltage. For example, the second data voltage may refer to a voltage that is generated by the drive transistor DT based on a voltage of the floating diffusion node FD further decreased through the second light integration operation.

In the fifth time period T5, the second transfer signal TX2 may be set to logic low, and the selection signal SEL may be set to logic high. As such, the image pixel PX2 may output the second data voltage through the data line DL in response to the selection signal SEL of logic high. In this case, the voltage hold circuit 141 may not provide the hold voltage VHOLD0 to the data line DL. According to the above description, the magnitude of the data line voltage VDL in the fifth time period T5 may be equal to the magnitude of the second data voltage.

In some example embodiments, when a transition from the second time period T2 to the third time period T3 is made, a first settle time may be required. Meanwhile, when a transition from the fourth time period T4 to the fifth time period T5 is made, a second settle time may be required. For example, the first settle time may refer to a time necessary until the data line voltage VDL transitions from the hold voltage VHOLD0 to the first data voltage and is settled. The second settle time may refer to a time necessary until the data line voltage VDL transitions from the hold voltage VHOLD0 to the second data voltage and is settled.

An operating speed of the analog-to-digital converter 1300 of FIG. 1 may decrease. That is, in the case where the settle time increases, the performance of an image sensor device may be reduced. For example, a length of the settle time may be determined by a difference between the data line voltage VDL before the transition is made and the data line voltage VDL after the transition is made.

In some example embodiments, a difference between the hold voltage VHOLD0 and the second data voltage may be greater than a difference between the hold voltage VHOLD0 and the first data voltage. Accordingly, a length of the second settle time may be longer than a length of the first settle time.

In some example embodiments, the pixel array 1100 of FIG. 2 may be included in the first semiconductor circuit substrate, and the voltage hold circuit 141 may be included in the second semiconductor circuit substrate. That is, the voltage hold circuit 141 may be manufactured through a process different from that of the pixel array 1100. Accordingly, the voltage hold circuit 141 may be difficult to provide a power supply voltage for a pixel array manufactured through a process different from that of the voltage hold circuit 141. As such, the voltage hold circuit 141 may include a plurality of transistors connected in parallel. For example, the voltage hold circuit 141 may be implemented to include a plurality of transistors in which magnitudes of an effective threshold voltage and/or transistor strengths are different from each other.

Figure 6:
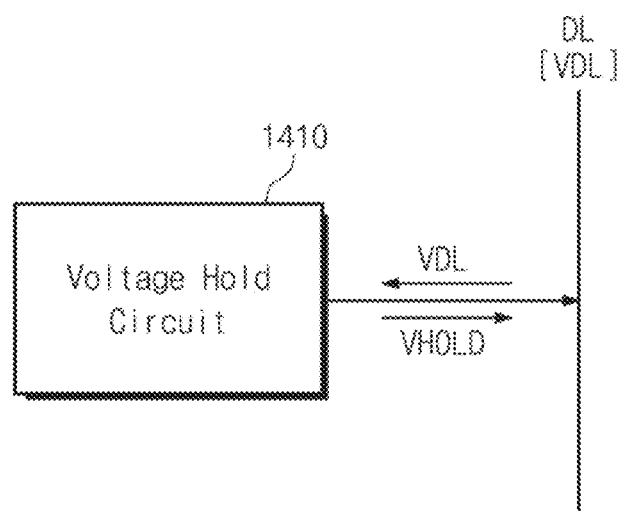
FIG. 6 is a block diagram illustrating a voltage hold circuit of FIG. 2 implemented according to some example embodiments of the present disclosure.

FIG. 6 is a block diagram illustrating a voltage hold circuit of FIG. 2 implemented according to some example embodiments of the present disclosure. Referring to FIGS. 2, 4, and 6, the voltage hold circuit 1410 may be connected with the data line DL.

The voltage hold circuit 1410 may detect a voltage level of the data line DL. For example, the voltage hold circuit 1410 may receive the data line voltage VDL from the data line DL.

The voltage hold circuit 1410 may generate a hold voltage based on the detected voltage level of the data line DL. For example, the voltage hold circuit 1410 may generate the hold voltage VHOLD based on the received data line voltage VDL.

The voltage hold circuit 1410 may provide the data line DL with the hold voltage VHOLD thus generated.

In some example embodiments, unlike the voltage hold circuit 141, the voltage hold circuit 1410 may be configured to receive the data line voltage VDL from the data line DL. For example, the voltage hold circuit 1410 may together receive the data line voltage VDL, which the analog-to-digital converter 1300 receives, through the data line DL.

In some example embodiments, a time period in which the voltage hold circuit 1410 receives the data line voltage VDL may be different from a time period in which the voltage hold circuit 1410 provides the hold voltage VHOLD to the data line DL.

While the voltage hold circuit 1410 receives the data line voltage VDL, the voltage hold circuit 1410 may store a voltage (e.g., a first voltage) based on the data line voltage VDL. The voltage hold circuit 1410 may generate the hold voltage VHOLD based on the stored voltage (e.g., the first voltage).

Figure 7:
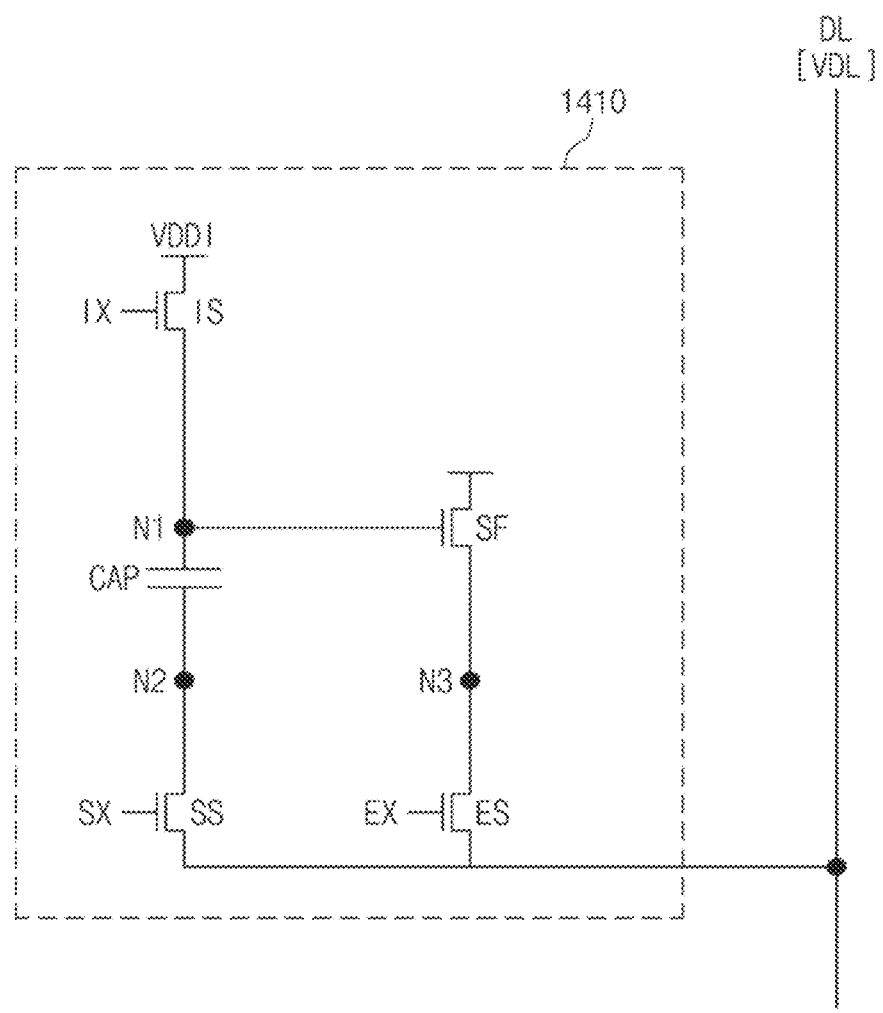
FIG. 7 is a circuit diagram illustrating a voltage hold circuit of FIG. 6.

FIG. 7 is a circuit diagram illustrating a voltage hold circuit of FIG. 6. Referring to FIG. 7, the voltage hold circuit 1410 may include a capacitor CAP, a source follower SF, an enable switch ES, a store switch SS, and an initialize switch IS. The voltage hold circuit 1410 may receive an initialization signal IX, a store signal SX, and an enable signal EX. In some example embodiments, the initialization signal IX, the store signal SX, and the enable signal EX may be provided from the sensor controller 1600 of FIG. 1.

The capacitor CAP may be connected between a first node N1 and a second node N2. The capacitor CAP may store a voltage based on the data line voltage VDL.

The source follower SF may be connected between the power supply voltage and a third node N3. The source follower SF may operate in response to a voltage of the first node N1. For example, the source follower SF may be configured to transfer a voltage corresponding to the variations in the voltage of the first node N1 to the third node N3.

The enable switch ES may be connected between the third node N3 and the data line DL. The enable switch ES may operate in response to the enable signal EX. For example, the enable switch ES may provide a voltage (e.g., the hold voltage VHOLD) of the third node N3 to the data line DL in response to the enable signal EX of logic high.

The store switch SS may be connected between the second node N2 and the data line DL. The store switch SS may operate in response to the store signal SX. For example, the store switch SS may transfer the data line voltage VDL to the capacitor CAP in response to the store signal SX of logic high.

In some example embodiments, unlike the embodiment illustrated in FIG. 7, the store switch SS may be implemented with a transmission gate switch.

The initialize switch IS may be connected with an initialization voltage VDDI and the first node N1. The initialize switch IS may operate in response to the initialization signal IX. For example, the initialize switch IS may provide the initialization voltage VDDI to the first node N1 in response to the initialization signal IX of logic high.

In some example embodiments, the initialization voltage VDDI may be different from the power supply voltage connected with the source follower SF. However, the present disclosure is not limited thereto. For example, the initialization voltage VDDI may be identical to the power supply voltage connected with the source follower SF.

In some example embodiments, the power supply voltage connected with the source follower SF and the initialization voltage VDDI may be different from the pixel array power supply voltage.

In some example embodiments, each of the enable switch ES, the store switch SS, and the initialize switch IS may be implemented with a transistor. For example, each of the enable switch ES, the store switch SS, and the initialize switch IS may be implemented with a transistor such as a bipolar junction transistor (BJT) or a field effect transistor (FET). In the present disclosure, for brevity of description, some example embodiments in which each of the enable switch ES, the store switch SS, and the initialize switch IS are implemented with an n-channel metal-oxide-semiconductor field-effect transistor (NMOS transistor) will be mainly described. However, the present disclosure is not limited thereto. For example, at least one of the enable switch ES, the store switch SS, and the initialize switch IS may be implemented with a p-channel metal-oxide-semiconductor field-effect transistor (PMOS transistor) or may be implemented with a transmission gate switch.

How the voltage hold circuit 1410 operates in response to the initialization signal IX, the store signal SX, and the enable signal EX will be described in detail with reference to the following drawings.

Figure 8:
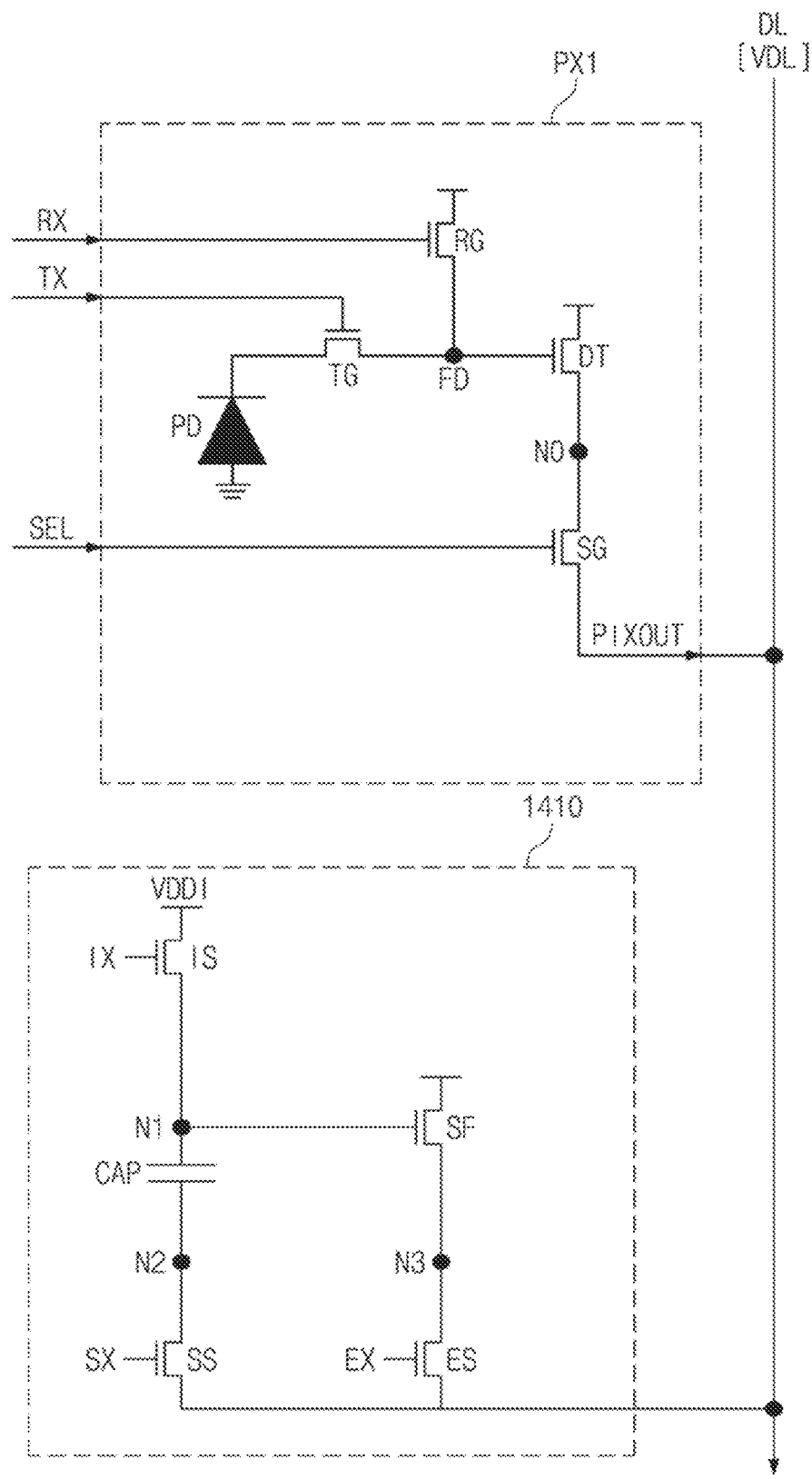
FIG. 8 is a circuit diagram illustrating an image pixel and a voltage hold circuit of FIG. 2 in detail.

FIG. 8 is a circuit diagram illustrating an image pixel and a voltage hold circuit of FIG. 2 in detail. Referring to FIGS. 2 and 8, the voltage hold circuit 1410 and the image pixel PX1 may be connected with the data line DL. The operation of the voltage hold circuit 1410 may be determined based on an operation timing of the image pixel PX1. That is, the initialization signal IX, the store signal SX, and the enable signal EX may be determined based on the reset signal RX, the transfer signal TX, and the selection signal SEL that the image pixel PX1 receives.

Figure 9:
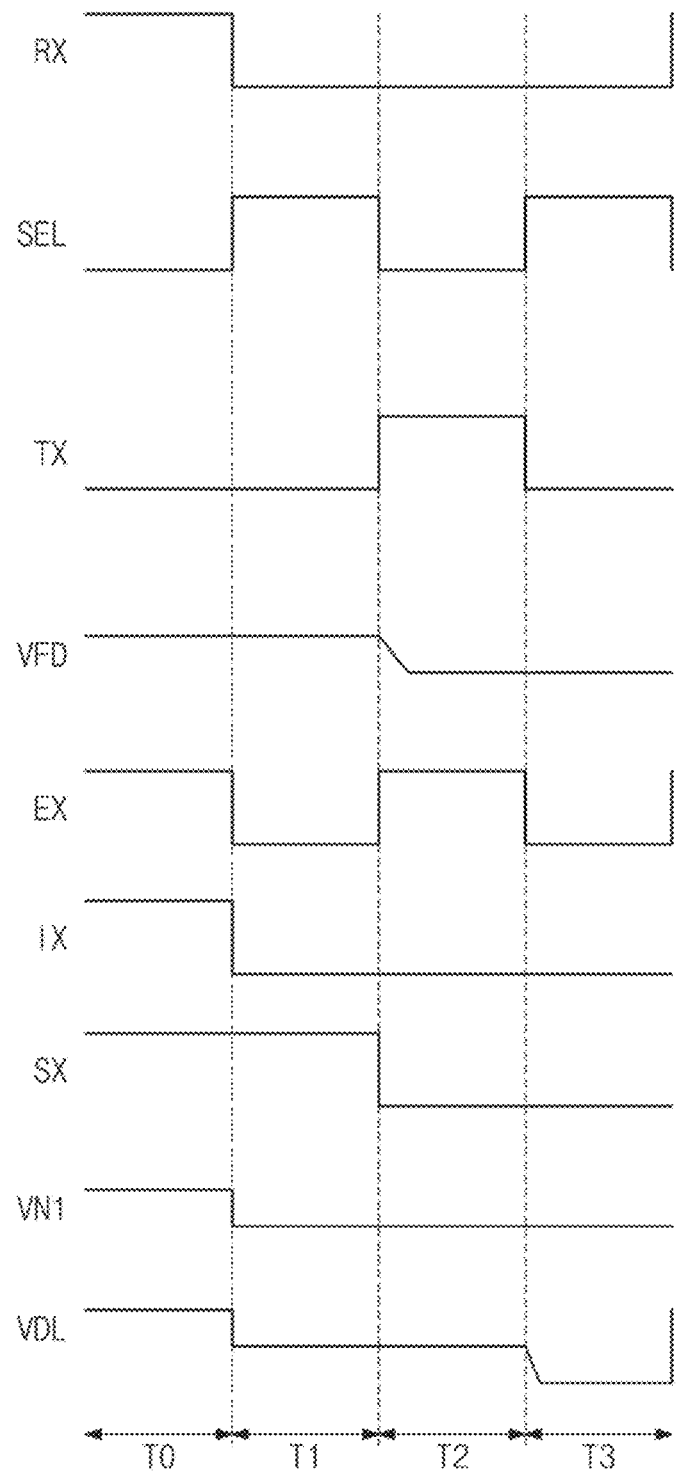
FIG. 9 is a timing diagram for describing an operation of a voltage hold circuit of FIG. 8.

FIG. 9 is a timing diagram for describing an operation of a voltage hold circuit of FIG. 8. Referring to FIGS. 2, 8, and 9, the reset operation may be performed on the image pixel PX1 in a 0-th time period T0. For example, in the 0-th time period T0, the reset signal RX may be set to logic high, and the selection signal SEL may be set to logic low. In this case, the reset gate RG may be turned on in response to the reset signal RX, and thus, the floating diffusion node voltage VFD may be charged to the power supply voltage. In contrast, the select gate SG that operates in response to the selection signal SEL may be turned off.

An initialize operation may be performed on the voltage hold circuit 1410 in the 0-th time period T0. For example, in the 0-th time period TO, all of the enable signal EX, the initialization signal IX, and the store signal SX may be set to logic high.

In a first time period T1, the analog-to-digital converter 1300 may perform the reset sampling operation on the reset voltage. For example, in the first time period T1, the reset signal RX may be set to logic low, and the selection signal SEL may be set to logic high. The image pixel PX1 may output the reset voltage through the data line DL in response to the selection signal SEL of logic high.

In the first time period T1, the voltage hold circuit 1410 may receive the reset voltage from the data line DL. For example, in the first time period T1, the initialization signal IX may be set to logic low, and the store signal SX may be at logic high. In this case, the voltage hold circuit 1410 may store a voltage in the capacitor CAP in response to the store signal SX of logic high. Accordingly, a first node voltage VN1 may change based on the reset voltage.

In the first time period T1, the voltage hold circuit 1410 may not provide the hold voltage VHOLD to the data line DL. According to the above description, in the first time period T1, a magnitude of the data line voltage VDL may be equal to a magnitude of the reset voltage.

In a second time period T2, the light integration operation may be performed on the image pixel PX1. For example, in the second time period T2, the transfer signal TX may be set to logic high, and the selection signal SEL may be set to logic low. As the transfer gate TG is turned on in response to the transfer signal TX of logic high, the floating diffusion node voltage VFD may decrease. The select gate SG may be turned off in response to the selection signal SEL of logic low.

In the second time period T2, the voltage hold circuit 1410 may provide the hold voltage VHOLD to the data line DL. For example, in the second time period T2, the store signal SX may be set to logic low, and the enable signal EX may be set to logic high. In this case, a voltage that the source follower SF outputs in response to the first node voltage VN1 may be provided to the data line DL.

In a third time period T3, the analog-to-digital converter 1300 may perform the data sampling operation on the received data voltage. For example, in the third time period T3, the transfer signal TX may be set to logic low, and the selection signal SEL may be set to logic high. The image pixel PX1 may output the data voltage through the data line DL in response to the selection signal SEL of logic high.

In the third time period T3, the voltage hold circuit 1410 may not provide the hold voltage VHOLD to the data line DL. For example, in the third time period T3, the enable signal EX may be set to logic low. According to the above description, the magnitude of the data line voltage VDL in the third time period T3 may be equal to the magnitude of the data voltage.

In some example embodiments, the operations of the image pixel PX1 and the voltage hold circuit 1410 may be periodically repeated. For example, the 0-th to third time periods T0 to T3 may be included in a single period. That is, after the third time period T3, the image pixel PX1 and the voltage hold circuit 1410 may respectively perform the reset operation and the initialize operation in a next period. In this case, within one period, the sampling operation of the analog-to-digital converter 1300 may not be performed after the third time period T3. Accordingly, the store signal SX may be set to logic low in the third time period T3. However, the present disclosure is not limited thereto. For example, a logic level of the store signal SX may be determined depending on the way to implement an image pixel. A logic level of the store signal SX corresponding to the case where an image pixel is implemented in the 5TR-2PD structure will be described in detail with reference to FIGS. 10 and 11.

In some example embodiments, the data line voltage VDL in the second time period T2 may be implemented to be substantially the same as the data line voltage VDL in the first time period T1. For example, the first node voltage VN1 may be determined based on the reset voltage received during the first time period T1. The source follower SF may be implemented to output the hold voltage VHOLD whose magnitude is substantially the same as that of the magnitude of the reset voltage, based on the first node voltage VN1 during the second time period T2. In this case, compared to FIG. 5A, when the transition from the second time period T2 to the third time period T3 is made, a difference between the data line voltage VDL before the transition and the data line voltage VDL after the transition may decrease, and thus, a settle time may decrease.

Figure 10:
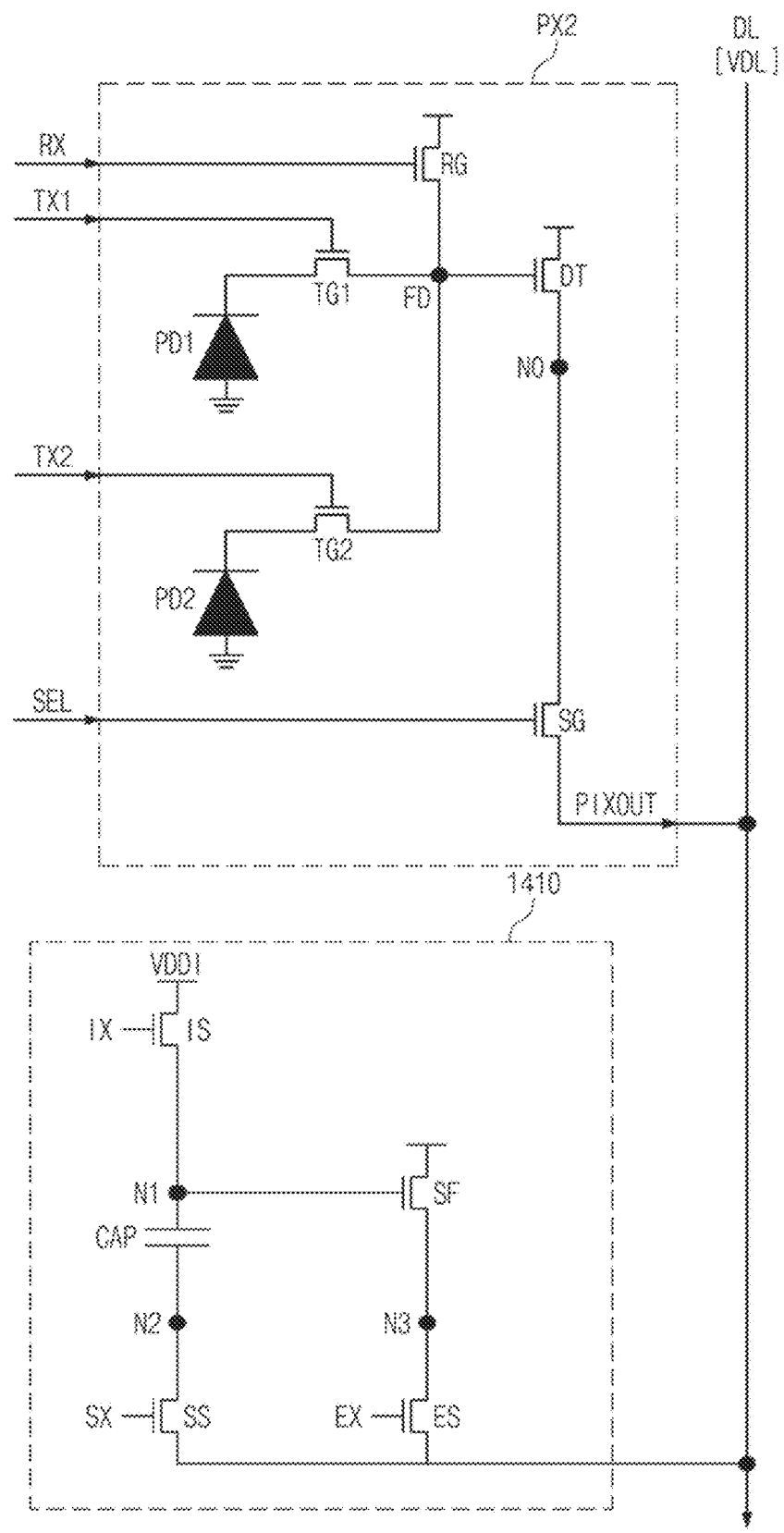
FIG. 10 is a circuit diagram illustrating an image pixel and a voltage hold circuit of FIG. 2 in detail.

FIG. 10 is a circuit diagram illustrating an image pixel and a voltage hold circuit of FIG. 2 in detail. Referring to FIGS. 2 and 10, the voltage hold circuit 1410 and the image pixel PX2 may be connected with the data line DL. The operation of the voltage hold circuit 1410 may be determined based on an operation timing of the image pixel PX2. That is, the initialization signal IX, the store signal SX, and the enable signal EX may be determined based on the reset signal RX, the first and second transfer signals TX1 and TX2, and the selection signal SEL that the image pixel PX2 receives.

Figure 11:
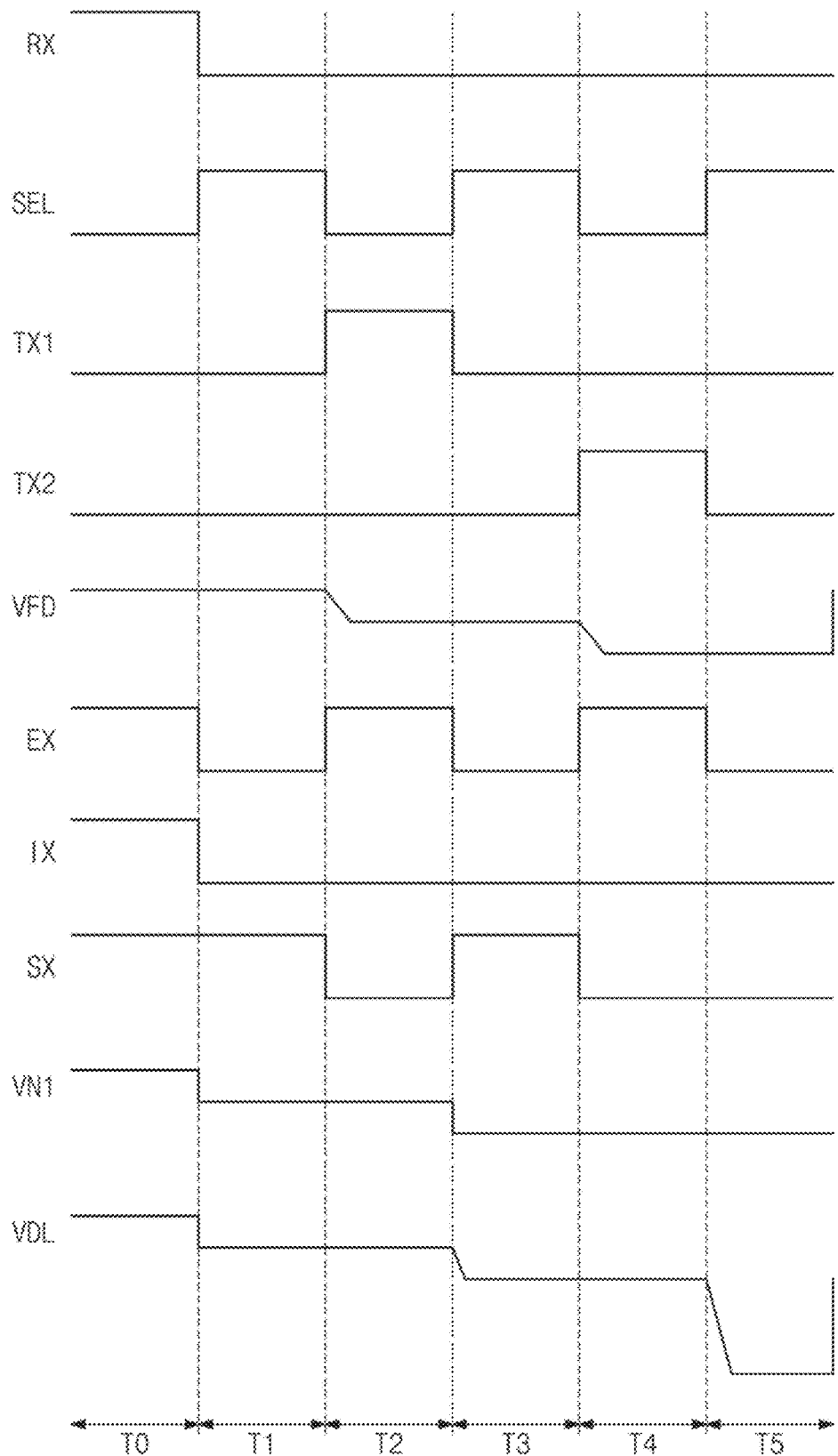
FIG. 11 is a timing diagram for describing an operation of a voltage hold circuit of FIG. 10.

FIG. 11 is a timing diagram for describing an operation of a voltage hold circuit of FIG. 10. Referring to FIGS. 2, 10, and 11, in a 0-th time period T0, the reset operation may be performed on the image pixel PX2, and the initialize operation may be performed on the voltage hold circuit 1410. In a first time period T1, the voltage hold circuit 1410 may receive the reset voltage.

Operations of the image pixel PX2 and the voltage hold circuit 1410 in the 0-th and first time periods T0 and T1 are substantially the same as the operations of the image pixel PX2 and the voltage hold circuit 1410 described with reference to FIGS. 8 and 9, and thus, additional description will be omitted to avoid redundancy.

In a second time period T2, a first light integration operation may be performed on the image pixel PX2. For example, in the second time period T2, the first transfer signal TX1 may be set to logic high, and the selection signal SEL may be set to logic low. As the first transfer gate TG1 is turned on in response to the first transfer signal TX1 of logic high, the floating diffusion node voltage VFD may decrease. The select gate SG may be turned off in response to the selection signal SEL of logic low.

In the second time period T2, the voltage hold circuit 1410 may provide the hold voltage VHOLD to the data line DL. For example, in the second time period T2, the store signal SX may be set to logic low, and the enable signal EX may be set to logic high. In this case, a voltage that the source follower SF outputs in response to the first node voltage VN1 may be provided to the data line DL.

In a third time period T3, the analog-to-digital converter 1300 may perform a first data sampling operation on a first data voltage. For example, in the third time period T3, the first transfer signal TX1 may be set to logic low, and the selection signal SEL may be set to logic high. As such, the image pixel PX2 may output the first data voltage through the data line DL in response to the selection signal SEL of logic high.

In the third time period T3, the voltage hold circuit 1410 may receive the first data voltage from the data line DL. For example, the store signal SX may be set to logic high in the third time period T3. In this case, the voltage hold circuit 1410 may store a voltage in the capacitor CAP in response to the store signal SX of logic high. That is, the first node voltage VN1 may change based on the first data voltage.

In the third time period T3, the voltage hold circuit 1410 may not provide the hold voltage VHOLD to the data line DL. For example, in the third time period T3, the enable signal EX may be set to logic low. According to the above description, the magnitude of the data line voltage VDL in the third time period T3 may be equal to the magnitude of the first data voltage.

In a fourth time period T4, a second light integration operation may be performed on the image pixel PX2. For example, in the fourth time period T4, the second transfer signal TX2 may be set to logic high, and the selection signal SEL may be set to logic low. As the second transfer gate TG2 is turned on in response to the second transfer signal TX2 of logic high, the floating diffusion node voltage VFD may further decrease. The select gate SG may be turned off in response to the selection signal SEL of logic low.

In the fourth time period T4, the voltage hold circuit 1410 may provide the hold voltage VHOLD to the data line DL. For example, in the fourth time period T4, the store signal SX may be set to logic low, and the enable signal EX may be set to logic high. In this case, a voltage that the source follower SF outputs in response to the first node voltage VN1 may be provided to the data line DL.

In a fifth time period T5, the analog-to-digital converter 1300 may perform a second data sampling operation on a second data voltage. For example, in the fifth time period T5, the second transfer signal TX2 may be set to logic low, and the selection signal SEL may be set to logic high. As such, the image pixel PX2 may output the second data voltage through the data line DL in response to the selection signal SEL of logic high.

In the fifth time period T5, the voltage hold circuit 1410 may not provide the hold voltage VHOLD to the data line DL. For example, in the fifth time period T5, the enable signal EX may be set to logic low. According to the above description, the magnitude of the data line voltage VDL in the fifth time period T5 may be equal to the magnitude of the second data voltage.

In some example embodiments, the operations of the image pixel PX2 and the voltage hold circuit 1410 may be periodically repeated. For example, the 0-th to fifth time periods T0 to T5 may be included in a single period. That is, after the fifth time period T5, the image pixel PX2 and the voltage hold circuit 1410 may respectively perform the reset operation and the initialize operation in a next period. In this case, within one period, the sampling operation of the analog-to-digital converter 1300 may not be performed after the fifth time period T5. Accordingly, the store signal SX may be set to logic low in the fifth time period T5. However, the present disclosure is not limited thereto. For example, a logic level of the store signal SX may be determined depending on the way to implement an image pixel.

In some example embodiments, the data line voltage VDL in the second time period T2 may be implemented to be substantially the same as the data line voltage VDL in the first time period T1. The data line voltage VDL in the fourth time period T4 may be implemented to be substantially the same as the data line voltage VDL in the third time period T3. For example, during the second time period T2, the source follower SF may be implemented to output the hold voltage VHOLD whose magnitude is the same as that of the magnitude of the reset voltage, based on the first node voltage VN1 in the first time period T1. During the fourth time period T4, the source follower SF may be implemented to output the hold voltage VHOLD whose magnitude is the same as that of the magnitude of the first data voltage, based on the first node voltage VN1 in the third time period T3. In this case, when the transition from the second time period T2 to the third time period T3 is made and the transition from the fourth time period T4 to the fifth time period T5 is made, compared to the case described with reference to FIG. 5B, a difference between the data line voltage VDL before the transition and the data line voltage VDL after the transition may decrease, and thus, a settle time may decrease.

In particular, unlike the data line voltage VDL in the fourth time period T4 of FIG. 5B, because the data line voltage VDL does not increase in the fourth time period T4 of FIG. 11B, an image sensor device in which a settle time decreases may be provided.

In some example embodiments, a magnitude of the hold voltage VHOLD in the second time period T2 may be different from a magnitude of the hold voltage VHOLD in the fourth time period T4.

In some example embodiments, a plurality of voltage hold circuits may be respectively connected with a plurality of data lines. In this case, a settle time distribution may be formed due to a difference between physical characteristics of elements constituting voltage hold circuits connected with data lines. However, in the case where the voltage holder 1400 of FIG. 1 is implemented with the voltage hold circuits 1410 of FIG. 6, because a magnitude of the hold voltage VHOLD is determined based on a magnitude of the data line voltage VDL, a settle time distribution may be minimized.

In some example embodiments, unlike the voltage hold circuit 141 of FIG. 4, the voltage hold circuit 1410 may not include a plurality of transistors connected in parallel. For example, the source follower SF, the enable switch ES, the store switch SS, and the initialize switch IS may be identical to or different from each other in transistor strength and/or effective threshold voltage. According to some example embodiments of the present disclosure, thus, an image sensor device that is more small-sized may be provided.

Figure 12:
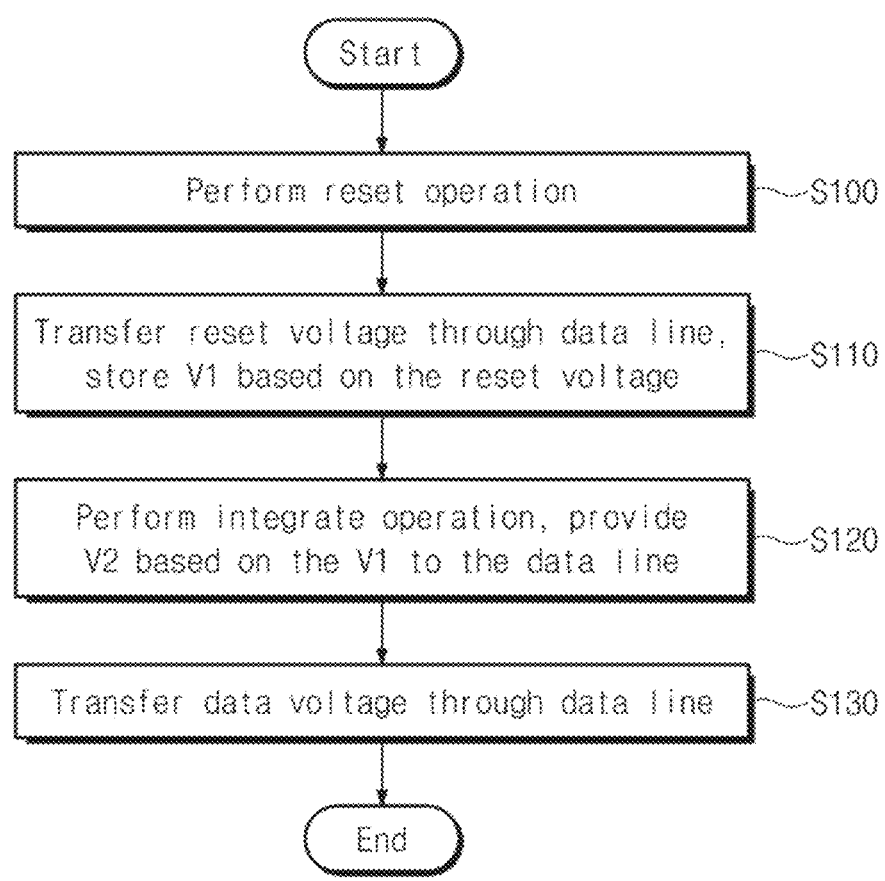
FIG. 12 is a flowchart illustrating an operation method of an image sensor device according to some example embodiments of the present disclosure.

FIG. 12 is a flowchart illustrating an operation method of an image sensor device according to some example embodiments of the present disclosure. Referring to FIGS. 8, 9, and 12, in operation S100, the image sensor device 1000 may perform the reset operation on the image pixel PX1. For example, in the 0-th time period T0, the sensor controller 1600 of the image sensor device 1000 may provide a reset signal of logic high to the image pixel PX1. In this case, the image sensor device 1000 may also perform the initialize operation on the voltage hold circuit 1410.

In operation S110, the image sensor device 1000 may transfer a reset voltage to the analog-to-digital converter 1300 through the data line DL and may store a first voltage V1 that is based on the reset voltage. For example, in the first time period T1, the voltage hold circuit 1410 of the image sensor device 1000 may receive the reset voltage. The voltage hold circuit 1410 may store a voltage in the capacitor CAP based on the received reset voltage. In this case, the voltage VN1 of the first node N1 between the capacitor CAP and the source follower SF may be referred to as a "first voltage V1".

In operation S120, the image sensor device 1000 may perform the light integration operation and may provide the data line with a second voltage V2 that is based on the first voltage V1. For example, in the second time period T2, the sensor controller 1600 of the image sensor device 1000 may provide the transfer signal TX of logic high to the image pixel PX1. The source follower SF of the voltage hold circuit 1410 may receive the first voltage V1 and may output the second voltage V2 to the data line DL.

In operation S130, the image sensor device 1000 may output a data voltage through the data line DL. In this case, the voltage hold circuit 1410 of the image sensor device 1000 may not provide the hold voltage VHOLD to the data line DL.

In some example embodiments, in the case where a pixel is implemented in the 4TR-1PD structure (e.g., in the case where the pixel is implemented with the image pixels PX1), the voltage hold circuit 1410 may not store the data voltage in operation S130.

In some example embodiments, in the case where a pixel is implemented in the 5TR-2PD structure (e.g., in the case where the pixel is implemented with the image pixels PX2), the voltage hold circuit 1410 may store the data voltage in operation S130. An operation of the image sensor device 1000 in which the pixel is implemented with the 5TR-2PD structure will be described in detail with reference to FIG. 13.

Figure 13:
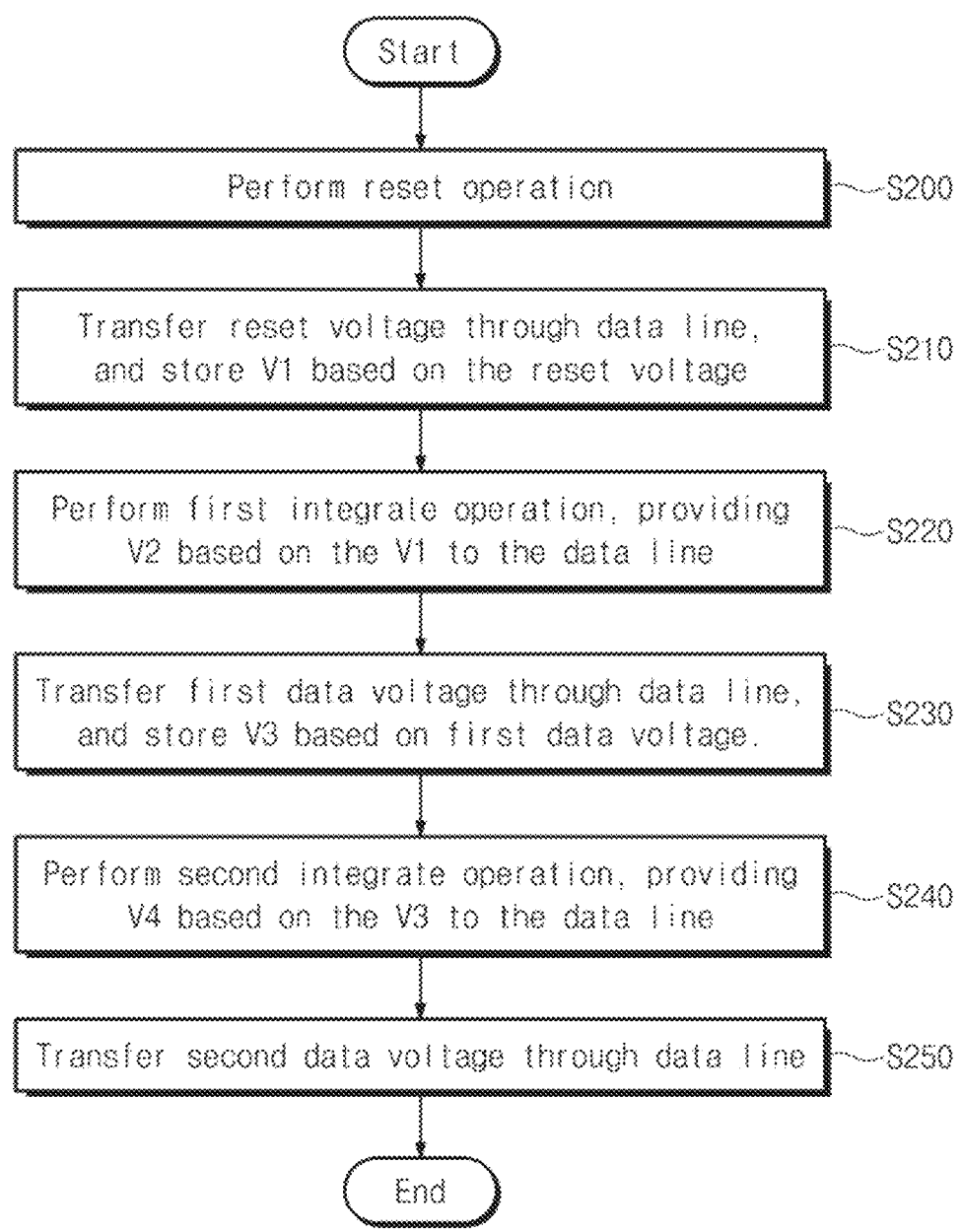
FIG. 13 is a flowchart illustrating an operation method of an image sensor device according to some example embodiments of the present disclosure.

FIG. 13 is a flowchart illustrating an operation method of an image sensor device according to some example embodiments of the present disclosure. Referring to FIGS. 10, 11, and 12, in operation S200, the image sensor device 1000 may perform the reset operation on the image pixel PX2.

In operation S210, the image sensor device 1000 may transfer a reset voltage to the analog-to-digital converter 1300 through the data line DL and may store the first voltage V1 that is based on the reset voltage.

In operation S220, the image sensor device 1000 may perform the first light integration operation and may provide the data line with the second voltage V2 that is based on the first voltage V1.

Operation S200 to operation S220 are substantially the same as operation S100 to operation S120 described with reference to FIG. 12, and thus, additional description will be omitted to avoid redundancy.

In operation S230, the image sensor device 1000 may output a first data voltage through the data line DL. The voltage hold circuit 1410 of the image sensor device 1000 may receive the first data voltage from the data line DL. For example, in the third time period T3, the voltage hold circuit 1410 may store a voltage in the capacitor CAP based on the first data voltage thus received. In this case, the voltage VN1 of the first node N1 between the capacitor CAP and the source follower SF may be referred to as a "third voltage V3".

In operation S240, the image sensor device 1000 may perform the second light integration operation and may provide the data line with a fourth voltage V4 that is based on the third voltage V3. For example, in the fourth time period T4, the sensor controller 1600 of the image sensor device 1000 may provide the second transfer signal TX2 of logic high to the image pixel PX2. The source follower SF of the voltage hold circuit 1410 may receive the third voltage V3 and may output the fourth voltage V4 to the data line DL.

In operation S250, the image sensor device 1000 may output a second data voltage through the data line DL. In this case, the voltage hold circuit 1410 of the image sensor device 1000 may not provide the hold voltage VHOLD to the data line DL.

Figure 14:
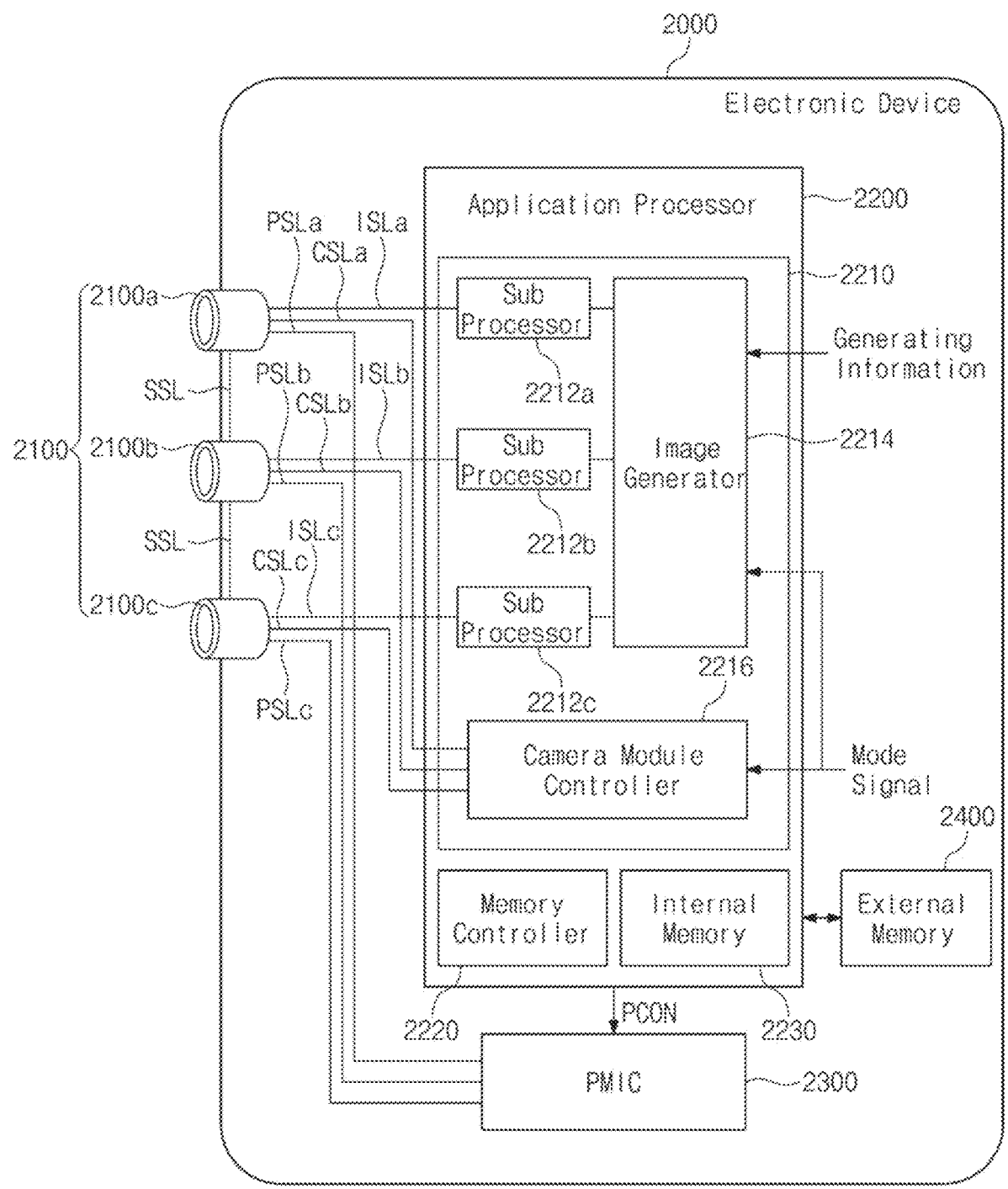
FIG. 14 is a block diagram illustrating a configuration of an electronic device including a multi-camera module according to some example embodiments of the present disclosure.

FIG. 14 is a block diagram of an electronic device including a multi-camera module according to some example embodiments of the present disclosure. Referring to FIG. 14, an electronic device 2000 may include a camera module group 2100, an application processor 2200, a PMIC 2300, and an external memory 2400.

The camera module group 2100 may include a plurality of camera modules 2100a, 2100b, and 2100c. An electronic device including three camera modules 2100a, 2100b, and 2100c is illustrated in FIG. 14, but the present disclosure is not limited thereto. In some example embodiments, the camera module group 2100 may be modified to include only two camera modules. Also, in some example embodiments, the camera module group 2100 may be modified to include "i" camera modules (i being a natural number of 4 or more).

Figure 15:
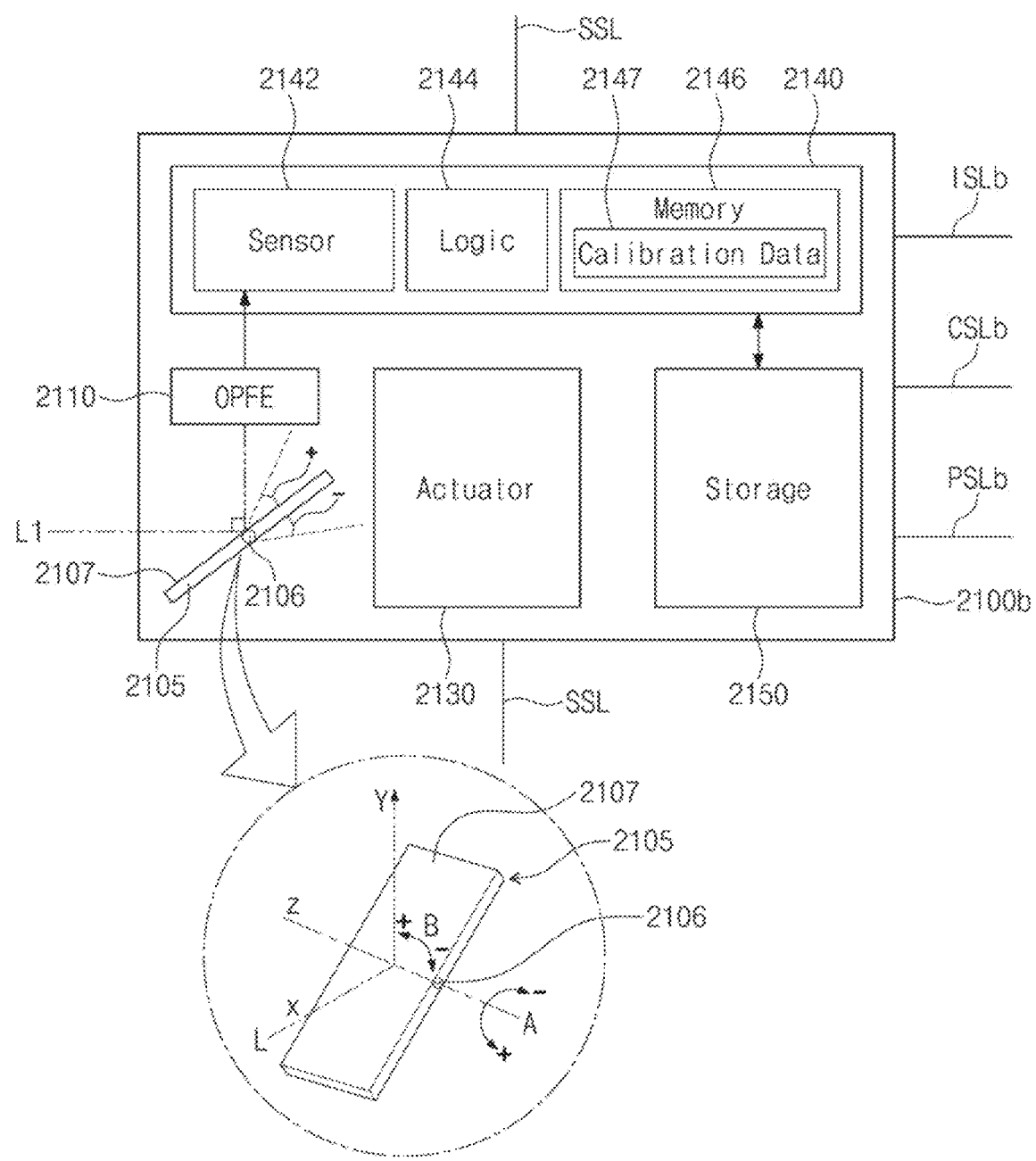
FIG. 15 is a block diagram illustrating a configuration of a camera module of FIG. 14.

FIG. 15 is a block diagram illustrating a camera module of FIG. 14 in detail. Below, a detailed configuration of the camera module 2100b will be more fully described with reference to FIG. 15, but the following description may be equally applied to the remaining camera modules 2100a and 2100c.

Referring to FIG. 15, the camera module 2100b may include a prism 2105, an optical path folding element (OPFE) 2110, an actuator 2130, an image sensing device 2140, and storage 2150.

The prism 2105 may include a reflecting plane 2107 of a light reflecting material and may change a path of a light "L" incident from the outside.

In some example embodiments, the prism 2105 may change a path of the light "L" incident in a first direction (X) to a second direction (Y) perpendicular to the first direction (X). Also, the prism 2105 may change the path of the light "L" incident in the first direction (X) to the second direction (Y) perpendicular to the first (X-axis) direction by rotating the reflecting plane 2107 of the light reflecting material in direction "A" about a central axis 2106 or rotating the central axis 2106 in direction "B". In this case, the OPFE 2110 may move in a third direction (Z) perpendicular to the first direction (X) and the second direction (Y).

In some example embodiments, as illustrated in FIG. 15, a maximum rotation angle of the prism 2105 in direction "A" may be equal to or smaller than 15 degrees in a positive A direction and may be greater than 15 degrees in a negative A direction, but the present disclosure is not limited thereto.

In some example embodiments, the prism 2105 may move within approximately 20 degrees in a positive or negative B direction, between 10 degrees and 20 degrees, or between 15 degrees and 20 degrees; here, the prism 2105 may move at the same angle in the positive or negative B direction or may move at a similar angle within approximately 1 degree.

In some example embodiments, the prism 2105 may move the reflecting plane 2107 of the light reflecting material in the third direction (e.g., Z direction) parallel to a direction in which the central axis 2106 extends.

The OPFE 2110 may include optical lenses composed of "m" groups (j being a natural number), for example. Here, "m" lens may move in the second direction (Y) to change an optical zoom ratio of the camera module 2100b. For example, when a default optical zoom ratio of the camera module 2100b is "Z", the optical zoom ratio of the camera module 2100b may be changed to an optical zoom ratio of 3Z, 5Z or more by moving "m" optical lens included in the OPFE 2110.

The actuator 2130 may move the OPFE 2110 or an optical lens (hereinafter referred to as an "optical lens") to a specific location. For example, the actuator 2130 may adjust a location of an optical lens such that an image sensor 2142 is placed at a focal length of the optical lens for accurate sensing.

The image sensing device 2140 may include the image sensor 2142, control logic 2144, and a memory 2146. The image sensor 2142 may sense an image of a sensing target by using the light "L" provided through an optical lens. In some example embodiments, a configuration and an operation of the image sensor 2142 may be similar to those of the image sensor device 1000 described with reference to FIGS. 1 to 13. As such, the camera module 1400b may support a fast operation of an analog-to-digital converter through fast settling of a data line when a data voltage generated from an image pixel is sensed. Accordingly, the camera module 1400b may support the fast generation of image data.

The control logic 2144 may control overall operations of the camera module 2100b. For example, the control logic 2144 may control an operation of the camera module 2100b based on a control signal provided through a control signal line CSLb.

The memory 2146 may store information, which is necessary for an operation of the camera module 2100b, such as calibration data 2147. The calibration data 2147 may include information necessary for the camera module 2100b to generate image data by using the light "L" provided from the outside. The calibration data 2147 may include, for example, information about the degree of rotation described above, information about a focal length, information about an optical axis, etc. In the case where the camera module 2100b is implemented in the form of a multi-state camera in which a focal length varies depending on a location of an optical lens, the calibration data 2147 may include a focal length value for each location (or state) of the optical lens and information about auto focusing.

The storage 2150 may store image data sensed through the image sensor 2142. The storage 2150 may be disposed outside the image sensing device 2140 and may be implemented in a shape where the storage 2150 and a sensor chip constituting the image sensing device 2140 are stacked. In some example embodiments, the storage 2150 may be implemented with an electrically erasable programmable read only memory (EEPROM), but the present disclosure is not limited thereto.

Referring together to FIGS. 14 and 15, in some example embodiments, each of the plurality of camera modules 2100a, 2100b, and 2100c may include the actuator 2130. As such, the same calibration data 2147 or different calibration data 2147 may be included in the plurality of camera modules 2100a, 2100b, and 2100c depending on operations of the actuators 2130 therein.

In some example embodiments, one camera module (e.g., 2100b) among the plurality of camera modules 2100a, 2100b, and 2100c may be a folded lens shape of camera module in which the prism 2105 and the OPFE 2110 described above are included, and the remaining camera modules (e.g., 2100a and 2100c) may be a vertical shape of camera module in which the prism 2105 and the OPFE 2110 described above are not included; however, the present disclosure is not limited thereto.

In some example embodiments, one camera module (e.g., 2100c) among the plurality of camera modules 2100a, 2100b, and 2100c may be, for example, a vertical shape of depth camera extracting depth information by using an infrared ray (IR). In this case, the application processor 2200 may merge image data provided from the depth camera and image data provided from any other camera module (e.g., 2100a or 2100b) and may generate a three-dimensional (3D) depth image.

In some example embodiments, at least two camera modules (e.g., 2100a and 2100b) among the plurality of camera modules 2100a, 2100b, and 2100c may have different fields of view. In this case, the at least two camera modules (e.g., 2100a and 2100b) among the plurality of camera modules 2100a, 2100b, and 2100c may include different optical lens, but the present disclosure is not limited thereto.

Also, in some example embodiments, fields of view of the plurality of camera modules 2100a, 2100b, and 2100c may be different. In this case, the plurality of camera modules 2100a, 2100b, and 2100c may include different optical lens, not limited thereto.

In some example embodiments, the plurality of camera modules 2100a, 2100b, and 2100c may be disposed to be physically separated from each other. That is, the plurality of camera modules 2100a, 2100b, and 2100c may not use a sensing area of one image sensor 2142, but the plurality of camera modules 2100a, 2100b, and 2100c may include independent image sensors 2142 therein, respectively.

Returning to FIG. 14, the application processor 2200 may include an image processing device 2210, a memory controller 2220, and an internal memory 2230. The application processor 2200 may be implemented to be separated from the plurality of camera modules 2100a, 2100b, and 2100c. For example, the application processor 2200 and the plurality of camera modules 2100a, 2100b, and 2100c may be implemented with separate semiconductor chips.

The image processing device 2210 may include a plurality of sub image processors 2212a, 2212b, and 2212c, an image generator 2214, and a camera module controller 2216.

The image processing device 2210 may include the plurality of sub image processors 2212a, 2212b, and 2212c, the number of which corresponds to the number of the plurality of camera modules 2100a, 2100b, and 2100c.

Image data respectively generated from the camera modules 2100a, 2100b, and 2100c may be respectively provided to the corresponding sub image processors 2212a, 2212b, and 2212c through separated image signal lines ISLa, ISLb, and ISLc. For example, the image data generated from the camera module 2100a may be provided to the sub image processor 2212a through the image signal line ISLa, the image data generated from the camera module 2100b may be provided to the sub image processor 2212b through the image signal line ISLb, and the image data generated from the camera module 2100c may be provided to the sub image processor 2212c through the image signal line ISLc. This image data transmission may be performed, for example, by using a camera serial interface (CSI) based on the MIPI (Mobile Industry Processor Interface), but the present disclosure is not limited thereto.

Meanwhile, in some example embodiments, one sub image processor may be disposed to correspond to a plurality of camera modules. For example, the sub image processor 2212a and the sub image processor 2212c may be integrally implemented, not separated from each other as illustrated in FIG. 14; in this case, one of the pieces of image data respectively provided from the camera module 2100a and the camera module 2100c may be selected through a selection element (e.g., a multiplexer), and the selected image data may be provided to the integrated sub image processor.

The image data respectively provided to the sub image processors 2212a, 2212b, and 2212c may be provided to the image generator 2214. The image generator 2214 may generate an output image by using the image data respectively provided from the sub image processors 2212a, 2212b, and 2212c, depending on image generating information Generating Information or a mode signal.

In detail, the image generator 2214 may generate the output image by merging at least a portion of the image data respectively generated from the camera modules 2100a, 2100b, and 2100c having different fields of view, depending on the image generating information Generation Information or the mode signal. Also, the image generator 2214 may generate the output image by selecting one of the image data respectively generated from the camera modules 2100a, 2100b, and 2100c having different fields of view, depending on the image generating information Generation Information or the mode signal.

In some example embodiments, the image generating information Generation Information may include a zoom signal or a zoom factor. Also, in some example embodiments, the mode signal may be, for example, a signal based on a mode selected from a user.

In the case where the image generating information Generation Information is the zoom signal (or zoom factor) and the camera modules 2100a, 2100b, and 2100c have different visual fields of view, the image generator 2214 may perform different operations depending on a kind of the zoom signal. For example, in the case where the zoom signal is a first signal, the image generator 2214 may merge the image data output from the camera module 2100a and the image data output from the camera module 2100c and may generate the output image by using the merged image signal and the image data output from the camera module 2100b that is not used in the merging operation. In the case where the zoom signal is a second signal different from the first signal, without the image data merging operation, the image generator 2214 may select one of the image data respectively output from the camera modules 2100a, 2100b, and 2100c and may output the selected image data as the output image. However, the present disclosure is not limited thereto, and a way to process image data may be modified without limitation if necessary.

In some example embodiments, the image generator 2214 may generate merged image data having an increased dynamic range by receiving a plurality of image data of different exposure times from at least one of the plurality of sub image processors 2212a, 2212b, and 2212c and performing high dynamic range (HDR) processing on the plurality of image data.

The camera module controller 2216 may provide control signals to the camera modules 2100a, 2100b, and 2100c, respectively. The control signals generated from the camera module controller 2216 may be respectively provided to the corresponding camera modules 2100a, 2100b, and 2100c through control signal lines CSLa, CSLb, and CSLc separated from each other.

One of the plurality of camera modules 2100a, 2100b, and 2100c may be designated as a master camera (e.g., 2100b) depending on the image generating information Generation Information including a zoom signal or the mode signal, and the remaining camera modules (e.g., 2100a and 2100c) may be designated as a slave camera. The above designation information may be included in the control signals, and the control signals including the designation information may be respectively provided to the corresponding camera modules 2100a, 2100b, and 2100c through the control signal lines CSLa, CSLb, and CSLc separated from each other.

Camera modules operating as a master and a slave may be changed depending on the zoom factor or an operating mode signal. For example, in the case where the field of view of the camera module 2100a is wider than the field of view of the camera module 2100b and the zoom factor indicates a low zoom ratio, the camera module 2100b may operate as a master, and the camera module 2100a may operate as a slave. In contrast, in the case where the zoom factor indicates a high zoom ratio, the camera module 2100a may operate as a master, and the camera module 2100b may operate as a slave.

In some example embodiments, the control signal provided from the camera module controller 2216 to each of the camera modules 2100a, 2100b, and 2100c may include a sync enable signal. For example, in the case where the camera module 2100b is used as a master camera and the camera modules 2100a and 2100c are used as a slave camera, the camera module controller 2216 may transmit the sync enable signal to the camera module 2100b. The camera module 2100b that is provided with sync enable signal may generate a sync signal based on the provided sync enable signal and may provide the generated sync signal to the camera modules 2100a and 2100c through a sync signal line SSL. The camera module 2100b and the camera modules 2100a and 2100c may be synchronized with the sync signal to transmit image data to the application processor 2200.

In some example embodiments, the control signal provided from the camera module controller 2216 to each of the camera modules 2100a, 2100b, and 2100c may include mode information according to the mode signal. Based on the mode information, the plurality of camera modules 2100a, 2100b, and 2100c may operate in a first operating mode and a second operating mode with regard to a sensing speed.

In the first operating mode, the plurality of camera modules 2100a, 2100b, and 2100c may generate image signals at a first speed (e.g., may generate image signals of a first frame rate), may encode the image signals at a second speed (e.g., may encode the image signal of a second frame rate higher than the first frame rate), and transmit the encoded image signals to the application processor 2200. In this case, the second speed may be 30 times or less the first speed.

The application processor 2200 may store the received image signals, that is, the encoded image signals in the memory 2230 provided therein or the external memory 2400 placed outside the application processor 2200. Afterwards, the application processor 2200 may read and decode the encoded image signals from the memory 2230 or the external memory 2400 and may display image data generated based on the decoded image signals. For example, the corresponding one among sub image processors 2212a, 2212b, and 2212c of the image processing device 2210 may perform decoding and may also perform image processing on the decoded image signal.

In the second operating mode, the plurality of camera modules 2100a, 2100b, and 2100c may generate image signals at a third speed (e.g., may generate image signals of a third frame rate lower than the first frame rate) and transmit the image signals to the application processor 2200. The image signals provided to the application processor 2200 may be signals that are not encoded. The application processor 2200 may perform image processing on the received image signals or may store the image signals in the memory 2230 or the external memory 2400.

The PMIC 2300 may supply powers, for example, power supply voltages to the plurality of camera modules 2100a, 2100b, and 2100c, respectively. For example, under control of the application processor 2200, the PMIC 2300 may supply a first power to the camera module 2100a through a power signal line PSLa, may supply a second power to the camera module 2100b through a power signal line PSLb, and may supply a third power to the camera module 2100c through a power signal line PSLc.

In response to a power control signal PCON from the application processor 2200, the PMIC 2300 may generate a power corresponding to each of the plurality of camera modules 2100a, 2100b, and 2100c and may adjust a level of the power. The power control signal PCON may include a power adjustment signal for each operating mode of the plurality of camera modules 2100a, 2100b, and 2100c. For example, the operating mode may include a low-power mode. In this case, the power control signal PCON may include information about a camera module operating in the low-power mode and a set power level. Levels of the powers respectively provided to the plurality of camera modules 2100a, 2100b, and 2100c may be identical to each other or may be different from each other. Also, a level of a power may be dynamically changed.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

The image sensor device 1000 (or other circuitry, for example, the decoder 1200, voltage holder 1400, voltage hold circuit 1410, I/O circuit 1500, sensor controller 1600, electronic device 2000, camera 2100*a* (2100*b*, 2100*c*, etc.), application processor 2200, and other circuitry discussed herein) may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

According to some example embodiments of the present disclosure, an image sensor device in which a voltage of a data line is maintained during a time period in which a data voltage is not output from an image pixel may be provided. In this case, because the variations in a voltage of the data line are minimized, a settle time of a data line voltage may decrease. Accordingly, an image sensor device with improved performance and an operation method thereof are provided.

While the present disclosure has been described with reference to example embodiments thereof, it will be apparent to those of ordinary skill in the art that various changes and modifications may be made thereto without departing from the spirit and scope of the present disclosure as set forth in the following claims.

What is claimed is:

1. An image sensor device comprising:
   an image pixel configured to
      output a reset voltage through a data line during a first time period and
      output a first data voltage through the data line during a second time period after the first time period; and
   a voltage hold circuit connected with the data line, and configured to:
      store a first voltage based on the reset voltage, and
      provide a second voltage based on the first voltage to the data line during a third time period between the first time period and the second time period.

2. The image sensor device of claim 1, wherein the image pixel is further configured to output a second data voltage through the data line during a fourth time period after the second time period, and
   wherein the voltage hold circuit is configured to:
      store a third voltage based on the first data voltage;
      provide a fourth voltage, based on the third voltage, to the data line during a fifth time period between the second time period and the fourth time period.

3. The image sensor device of claim 2, wherein the fourth voltage is different in magnitude from the second voltage.

4. The image sensor device of claim 1, wherein the voltage hold circuit includes:
   a capacitor connected between a first node and a second node;
   a source follower connected between a power supply voltage and a third node, and configured to operate in response to a voltage of the first node;
   an enable switch connected between the third node and the data line;
   a store switch connected between the second node and the data line; and
   an initialize switch connected between an initialization voltage and the first node.

5. The image sensor device of claim 4, wherein the store switch is configured to be turned on in the first time period and is configured to be turned off in the third time period.

6. The image sensor device of claim 4, wherein the enable switch is configured to be turned off in the first time period and the second time period and is configured to be turned on in the third time period.

7. The image sensor device of claim 4, wherein the initialize switch, the store switch, and the enable switch are configured to be turned on during a 0-th time period before the first time period.

8. The image sensor device of claim 7, wherein a magnitude of a voltage of the data line in the 0-th time period is different from a magnitude of the second voltage.

9. The image sensor device of claim 1, wherein the image pixel is included in a first semiconductor circuit substrate, and
   wherein the voltage hold circuit is included in a second semiconductor circuit substrate connected with the first semiconductor circuit substrate.

10. An image sensor device comprising:
    a decoder configured to output a reset signal, a first transfer signal, and a selection signal;
    an image pixel configured to output a pixel output voltage through a data line in response to the reset signal, the first transfer signal, and the selection signal;
    a voltage hold circuit connected with the data line; and
    a sensor controller configured to control the decoder and the voltage hold circuit,
    wherein the voltage hold circuit includes:
       a capacitor connected between a first node and a second node;
       a source follower connected between a first power supply voltage and a third node, and configured to operate in response to a voltage of the first node;
       an enable switch connected between the third node and the data line;
       a store switch connected between the second node and the data line; and
       an initialize switch connected between an initialization voltage and the first node.

11. The image sensor device of claim 10, wherein the image pixel includes:
    a first photodiode configured to accumulate charges in response to a first light signal;
    a first transfer gate connected between the first photodiode and a floating diffusion node, and configured to operate in response to the first transfer signal;
    a reset gate connected between a second power supply voltage and the floating diffusion node, and configured to operate in response to the reset signal;

a drive transistor connected between the second power supply voltage and a 0-th node, and configured to operate in response to a voltage of the floating diffusion node; and a select gate connected between the 0-th node and the data line, and configured to operate in response to the selection signal.

12. The image sensor device of claim 11, wherein the voltage hold circuit is configured to:

detect a voltage level of the data line during a first time period in which the select gate is turned on; and provide a hold voltage to the data line during a second time period in which the select gate is turned off.

13. The image sensor device of claim 12, wherein the decoder is configured to further output a second transfer signal, and wherein the image pixel further includes:

a second photodiode configured to accumulate charges in response to a second light signal; and a second transfer gate connected between the second photodiode and the floating diffusion node, and configured to operate in response to the second transfer signal.

14. The image sensor device of claim 13, wherein the pixel output voltage includes a reset voltage, a first data voltage, and a second data voltage, wherein the image pixel is configured to:

generate the reset voltage in response to that the reset signal transitions to logic high;

generate the first data voltage in response to that the first transfer signal transitions to logic high; and generate the second data voltage in response to that the second transfer signal transitions to logic high.

15. The image sensor device of claim 14, wherein a voltage level of the data line in the first time period is a level of the reset voltage or a level of the first data voltage.

16. An operation method of an image sensor device which includes a pixel configured to convert a light signal received from an output into an electrical signal and to output the electrical signal through a data line, the method comprising:

performing a reset operation on the pixel;

storing a first voltage, based on a reset voltage generated through the reset operation, in a voltage hold circuit while the reset voltage is output through the data line during a first time period;

providing a second voltage during a second time period after the first time period, generated based on the first voltage, from the voltage hold circuit to the data line while a first light integration operation is performed on the pixel; and outputting a first data voltage during a third time period after the second time period, generated through the first light integration operation, through the data line.

17. The method of claim 16, further comprising:

performing a second light integration operation on the pixel; and outputting a second data voltage, generated through the second light integration operation, through the data line.

18. The method of claim 17, further comprising:

storing a third voltage, based on the first data voltage, in the voltage hold circuit while the first data voltage is output through the data line; and providing a fourth voltage, based on the third voltage, from the voltage hold circuit to the data line while the second light integration operation is performed on the pixel.

19. The method of claim 18, wherein a magnitude of the fourth voltage is different from a magnitude of the second voltage.

* * * * *